United States Patent
Daughton et al.

(10) Patent No.: US 7,813,165 B2
(45) Date of Patent: Oct. 12, 2010

(54) MAGNETIC MEMORY LAYERS THERMAL PULSE TRANSITIONS

(75) Inventors: James M. Daughton, Eden Prairie, MN (US); Arthur V. Pohm, Ames, IA (US)

(73) Assignee: NVE Corporation, Eden Prairie, MN (US)

( * ) Notice: Subject to any disclaimer, the term of this patent is extended or adjusted under 35 U.S.C. 154(b) by 59 days.

(21) Appl. No.: 11/881,097

(22) Filed: Jul. 25, 2007

(65) Prior Publication Data

US 2007/0268743 A1 Nov. 22, 2007

Related U.S. Application Data

(62) Division of application No. 11/651,729, filed on Jan. 10, 2007, now Pat. No. 7,266,013, which is a division of application No. 11/292,635, filed on Dec. 2, 2005, now Pat. No. 7,177,178, which is a division of application No. 10/706,613, filed on Nov. 12, 2003, now Pat. No. 7,023,723.

(60) Provisional application No. 60/425,386, filed on Nov. 12, 2002.

(51) Int. Cl.
G11C 5/06 (2006.01)
G11C 5/08 (2006.01)
G11C 11/02 (2006.01)
G11C 11/14 (2006.01)
G11C 11/15 (2006.01)

(52) U.S. Cl. ............... 365/158; 365/171; 365/173; 365/66

(58) Field of Classification Search .......... 365/158, 365/171, 173, 51, 63, 66
See application file for complete search history.

(56) References Cited

U.S. PATENT DOCUMENTS

| 4,771,347 | A | | 9/1988 | Horimai et al. |
| 4,780,848 | A | | 10/1988 | Daughton et al. |
| 5,636,159 | A | | 6/1997 | Pohm |
| 5,650,958 | A | * | 7/1997 | Gallagher et al. ........... 365/173 |
| 5,841,692 | A | | 11/1998 | Gallagher |
| 6,072,718 | A | * | 6/2000 | Abraham et al. ............ 365/173 |
| 6,351,410 | B1 | * | 2/2002 | Nakao et al. ................. 365/171 |
| 6,381,171 | B1 | * | 4/2002 | Inomata et al. ............. 365/173 |
| 6,385,082 | B1 | | 5/2002 | Abraham et al. |

(Continued)

OTHER PUBLICATIONS

Beech, R.S. et al. Curie point written magnetoresistive memory; Journal of Applied Physics, vol. 87, No. 9; May 1, 2000; pp. 6403-6405.

*Primary Examiner*—J. H. Hur
(74) *Attorney, Agent, or Firm*—Kinney & Lange, P.A.

(57) ABSTRACT

A ferromagnetic thin-film based digital memory having bit structures therein with a magnetic material film in which a magnetic property thereof is maintained below a critical temperature above which such magnetic property is not maintained, and may also have a plurality of word line structures each with heating sections located across from the magnetic material film in a corresponding one of the bit structures. These bit structures are sufficiently thermally isolated to allow selected currents in the adjacent word lines or in the bit structure, or both, to selectively heat the bit structure to approach the critical temperature. Such bit structures may have three magnetic material layers each with its own critical temperature for maintaining versus not maintaining a magnetic property thereof.

9 Claims, 24 Drawing Sheets

U.S. PATENT DOCUMENTS

| | | |
|---|---|---|
| 6,535,416 B1 | 3/2003 | Daughton et al. |
| 6,538,919 B1 | 3/2003 | Abraham et al. |
| 6,538,921 B2 | 3/2003 | Daughton et al. |
| 6,597,049 B1 * | 7/2003 | Bhattacharyya et al. ..... 257/421 |
| 6,603,678 B2 | 8/2003 | Nickel et al. |
| 6,704,220 B2 | 3/2004 | Leuschner |
| 6,724,674 B2 | 4/2004 | Abraham et al. |
| 6,744,086 B2 | 6/2004 | Daughton et al. |
| 6,744,651 B2 | 6/2004 | Tang |
| 6,771,534 B2 | 8/2004 | Stipe |
| 6,777,730 B2 | 8/2004 | Daughton et al. |
| 6,963,098 B2 | 11/2005 | Daughton et al. |
| 7,023,723 B2 | 4/2006 | Daughton et al. |
| 7,177,178 B2 | 2/2007 | Daughton et al. |
| 2001/0019461 A1 | 9/2001 | Allenspach et al. |
| 2002/0089874 A1 * | 7/2002 | Nickel et al. ................. 365/171 |
| 2003/0198113 A1 * | 10/2003 | Abraham et al. ............ 365/211 |
| 2003/0206434 A1 * | 11/2003 | Leuschner .................. 365/173 |
| 2004/0057263 A1 * | 3/2004 | Tang .......................... 365/33 |

* cited by examiner

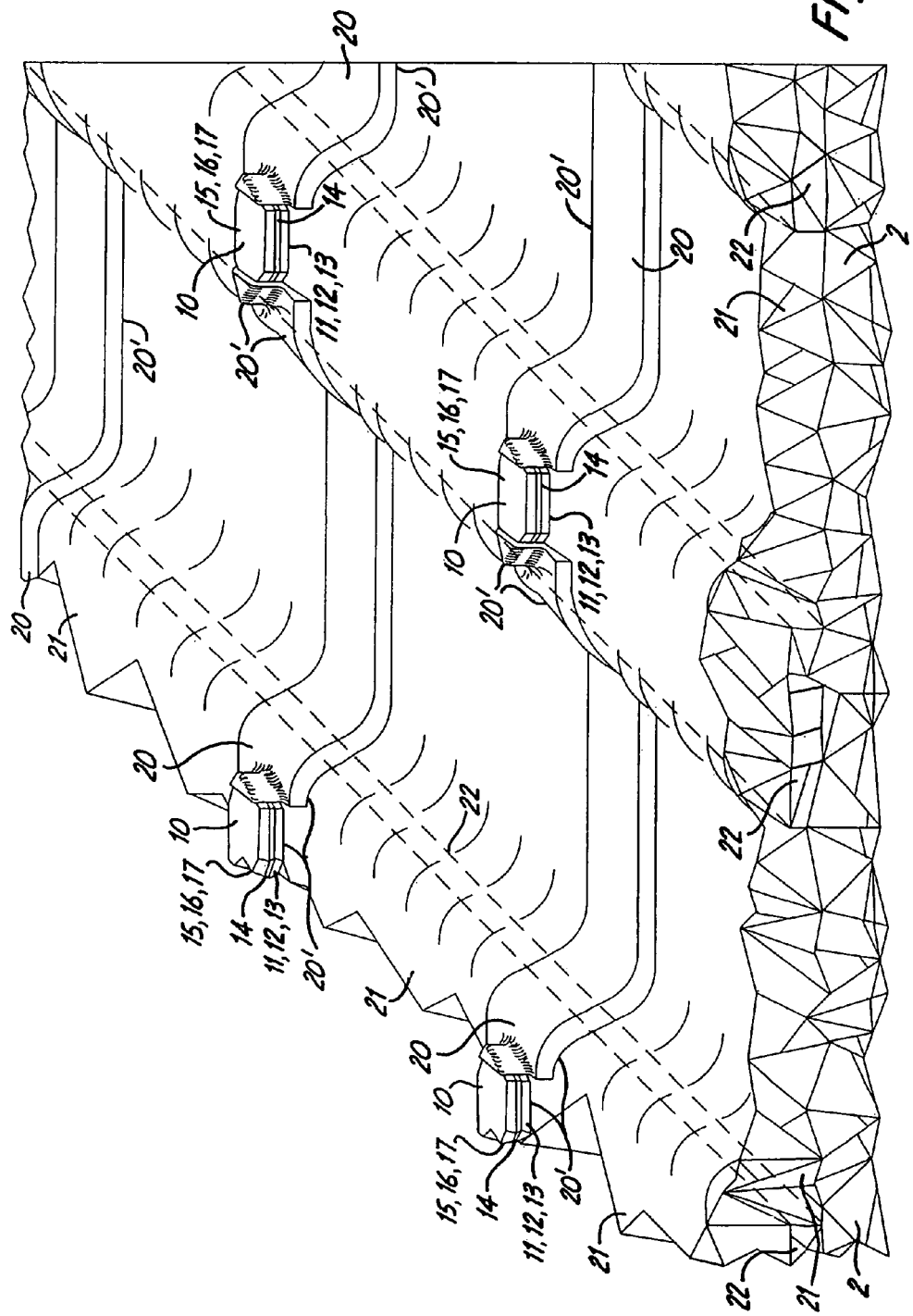

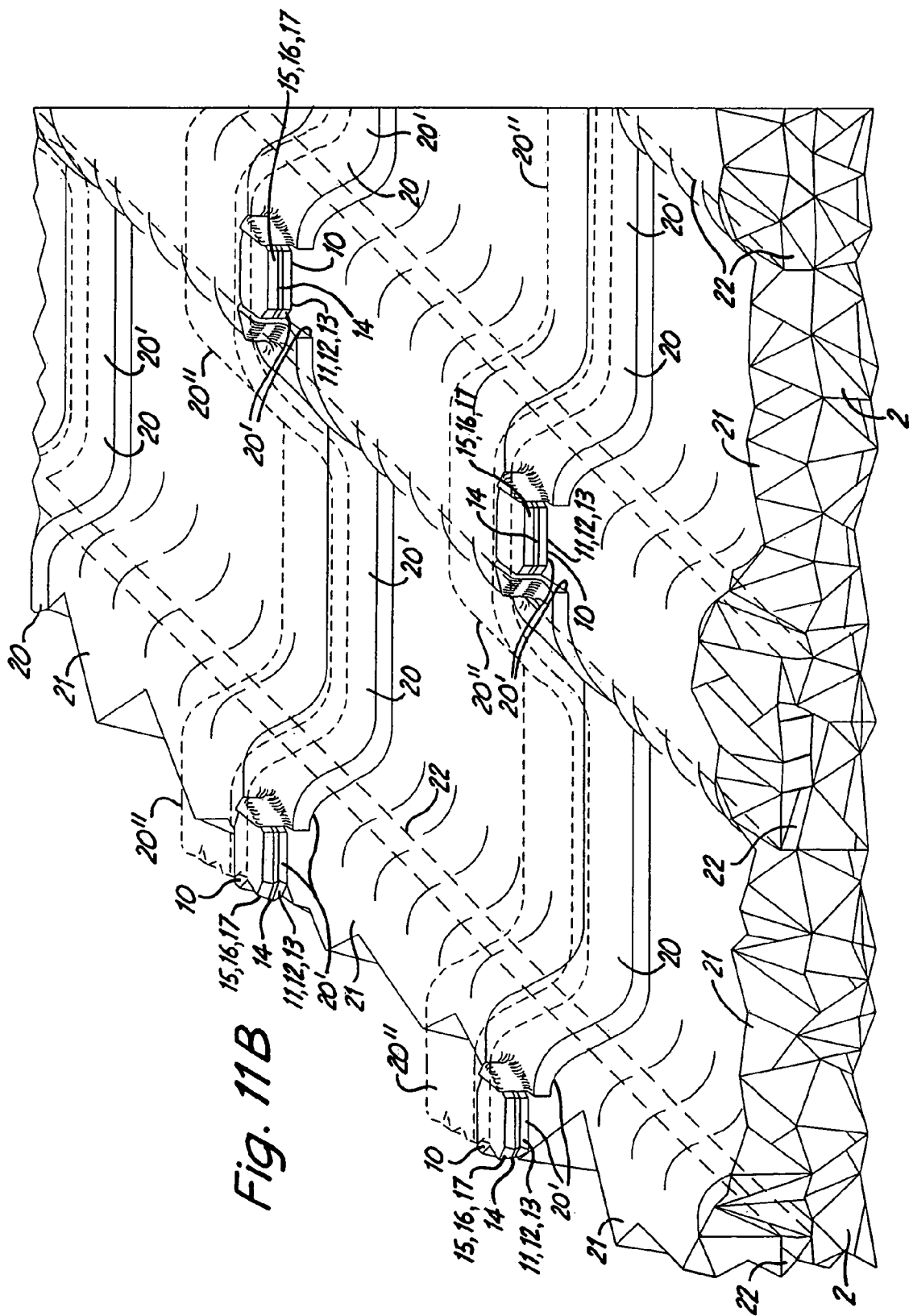

MAGNETIC MEMORY LAYERS THERMAL PULSE TRANSITIONS

CROSS-REFERENCE TO RELATED APPLICATIONS

This application is a divisional of U.S. patent application Ser. No. 11/651,729 filed on Jan. 10, 2007, now U.S. Pat. No. 7,266,013 issued on Sep. 4, 2007 for "MAGNETIC MEMORY LAYERS THERMAL PULSE TRANSITIONS", which application is a divisional of U.S. patent application Ser. No. 11/292,635 filed on Dec. 2, 2005, now U.S. Pat. No. 7,177,178 issued on Feb. 13, 2007 for "MAGNETIC MEMORY LAYERS THERMAL PULSE TRANSITIONS", which application is a divisional of U.S. patent application Ser. No. 10/706,613 filed on Nov. 12, 2003, now U.S. Pat. No. 7,023,723 issued on Apr. 4, 2006 for "MAGNETIC MEMORY LAYERS THERMAL PULSE TRANSITIONS", which application claims the benefit of Provisional Application No. 60/425,386 filed Nov. 12, 2002 for "MAGNETIC MEMORY LAYERS THERMAL PULSE TRANSITIONS".

BACKGROUND OF THE INVENTION

The present invention relates to ferromagnetic thin-film structures exhibiting relatively large magnetoresistive characteristics and, more particularly, to such structures used for the storage and retrieval of digital data.

Many kinds of electronic systems make use of magnetic devices including both digital systems, such as memories, and analog systems such as magnetic field sensors. Digital data memories are used extensively in digital systems of many kinds including computers and computer systems components, and digital signal processing systems. Such memories can be advantageously based on the storage of digital symbols as alternative states of magnetization in magnetic materials provided in each memory storage cell, the result being memories which use less electrical power and do not lose information upon removals of such electrical power.

Such memory cells, and magnetic field sensors also, can often be advantageously fabricated using ferromagnetic thin-film materials, and are often based on magnetoresistive sensing of magnetic states, or magnetic conditions, therein. Such devices may be provided on a surface of a monolithic integrated circuit to provide convenient electrical interconnections between the device and the operating circuitry therefor.

Ferromagnetic thin-film memory cells, for instance, can be made very small and packed very closely together to achieve a significant density of information storage, particularly when so provided on the surface of a monolithic integrated circuit. In this situation, the magnetic environment can become quite complex with fields in any one memory cell affecting the film portions in neighboring memory cells. Also, small ferromagnetic film portions in a memory cell can lead to substantial demagnetization fields which can cause instabilities in the magnetization state desired in such a cell.

These magnetic effects between neighbors in an array of closely packed ferromagnetic thin-film memory cells can be ameliorated to a considerable extent by providing a memory cell based on an intermediate separating material having two major surfaces on each of which an anisotropic ferromagnetic memory thin-film is provided. Such an arrangement provides significant "flux closure," i.e. a more closely confined magnetic flux path, to thereby confine the magnetic field arising in the cell to affecting primarily just that cell. This result is considerably enhanced by choosing the separating material in the ferromagnetic thin-film memory cells to each be sufficiently thin. Similar "sandwich" structures are also used in magnetic sensors.

In the recent past, reducing the thicknesses of the ferromagnetic thin-films and the intermediate layers in extended "sandwich" structures, and adding possibly alternating ones of such films and layers, i.e. superlattices, have been shown to lead to a "giant magnetoresistive effect" being present in some circumstances. This effect yields a magnetoresistive response which can be in the range of up to an order of magnitude or more greater than that due to the well known anisotropic magnetoresistive response.

In the ordinary anisotropic magnetoresistive response, varying the difference occurring between the direction of the magnetization vector in a ferromagnetic thin-film and the direction of sensing currents passed through that film leads to varying effective electrical resistance in the film in the direction of the current. The maximum electrical resistance occurs when the magnetization vector in the field and the current direction therein are parallel to one another, while the minimum resistance occurs when they are perpendicular to one another. The total electrical resistance in such a magnetoresistive ferromagnetic film can be shown to be given by a constant value, representing the minimum resistance, plus an additional value depending on the angle between the current direction in the film and the magnetization vector therein. This additional resistance has a magnitude characteristic that follows the square of the cosine of that angle.

Operating magnetic fields imposed externally can be used to vary the angle of the magnetization vector in such a film portion with respect to the easy axis of that film. Such an axis comes about in the film because of an anisotropy therein typically resulting from depositing the film during fabrication in the presence of an external magnetic field oriented in the plane of the film along the direction desired for the easy axis in the resulting film. During subsequent operation of the device having this resulting film, such operational magnetic fields imposed externally can be used to vary the angle to such an extent as to cause switching of the film magnetization vector between two stable states which occur for the magnetization being oriented in opposite directions along the film's easy axis. The state of the magnetization vector in such a film can be measured, or sensed, by the change in resistance encountered by current directed through this film portion. This arrangement has provided the basis for a ferromagnetic, magnetoresistive anisotropic thin-film to serve as a memory cell.

In contrast to this arrangement, the resistance in the plane of a ferromagnetic thin-film is isotropic for the giant magnetoresistive effect rather than depending on the direction of the sensing current therethrough as for the anisotropic magnetoresistive effect. The giant magnetoresistive effect involves a change in the electrical resistance of the structure thought to come about from the passage of conduction electrons between the ferromagnetic layers in the "sandwich" structure, or superlattice structure, through the separating nonmagnetic layers with the resulting scattering occurring at the layer interfaces, and in the ferromagnetic layers, being dependent on the electron spins. The magnetization dependant component of the resistance in connection with this effect varies as the sine of the absolute value of half the angle between the magnetization vectors in the ferromagnetic thin-films provided on either side of an intermediate nonmagnetic layer. The electrical resistance in the giant magnetoresistance effect through the "sandwich" or superlattice structure is lower if the magnetizations in the separated ferromagnetic thin-films are parallel and oriented in the same direction than it is if these magnetizations are antiparallel, i.e. oriented in opposing or partially opposing directions. Further, the anisotropic magnetoresistive effect in very thin films is considerably reduced from the bulk values therefor in thicker films due to surface scattering, whereas a significant giant magnetoresistive effect is obtained only in very thin films. Nevertheless, the anisotropic magnetoresistive effect remains present in the films used in giant magnetoresistive effect structures.

A memory cell based on the "giant magnetoresistive effect" can be provided by having one of the ferromagnetic layers in the "sandwich" construction being prevented from switching the magnetization direction therein from pointing along the easy axis therein in one to the opposite direction in the presence of suitable externally applied magnetic fields while permitting the remaining ferromagnetic layer to be free to do so in the same externally applied fields. In one such arrangement, a "spin-valve" structure is formed by providing an antiferromagnetic layer on the ferromagnetic layer that is to be prevented from switching in the externally applied fields to "pin" its magnetization direction in a selected direction. In an alternative arrangement often termed a "pseudo-spin valve" structure, the ferromagnetic layer that is to be prevented from switching in the externally applied fields is made sufficiently thicker than the free ferromagnetic layer so that it does not switch in those external fields provided to switch the free layer.

Thus, a digital data memory cell based on the use of structures exhibiting the giant magnetoresistive effect is attractive as compared to structures based on use of an anisotropic magnetoresistive effect because of the larger signals obtainable in information retrieval operations with respect to such cells. Such larger magnitude signals are easier to detect without error in the presence of noise thereby leading to less critical requirements on the retrieval operation circuitry.

An alternative digital data bit storage and retrieval memory cell suited for fabrication with submicron dimensions can be fabricated that provides rapid retrievals of bit data stored therein and low power dissipation memory through use of a cell structure that has a spin dependent tunneling junction (SDTJ), or magnetoresistive tunnel junction (MTJ), device therein based on a pair of ferromagnetic thin-film layers having an electrical insulator layer therebetween of sufficient thinness to allow tunneling currents therethrough. This memory cell can be fabricated using ferromagnetic thin-film materials of similar or different kinds in each of the magnetic memory films present in such a "sandwich" structure on either side of an intermediate nonmagnetic layer where such ferromagnetic films may be composite films, but this intermediate nonmagnetic layer conducts electrical current therethrough based primarily on the quantum electrodynamic effect "tunneling" current mentioned above.

This "tunneling" current has a magnitude dependence on the angle between the magnetization vectors in each of the ferromagnetic layers on either side of the intermediate layer due to the transmission barrier provided by this intermediate layer depending on the degree of matching of the spin polarizations of the electrons tunneling therethrough with the spin polarizations of the conduction electrons in the ferromagnetic layers, the latter being set by the layer magnetization directions to provide a "magnetic valve effect". Such an effect results in an effective resistance or conductance characterizing this intermediate layer with respect to the "tunneling" current therethrough. In addition, an antiferromagnetic layer against one of the ferromagnetic layers is used in such a cell to provide different magnetization switching thresholds between that ferromagnetic layer and the other by fixing, or "pinning", the magnetization direction for the adjacent ferromagnetic layer while leaving the other free to respond to externally applied fields. Such devices may be provided on a surface of a monolithic integrated circuit to thereby allow providing convenient electrical connections between each such memory cell device and the operating circuitry therefor.

A "sandwich" structure for such a memory cell, based on having an intermediate thin layer of a nonmagnetic, dielectric separating material with two major surfaces on each of which a anisotropic ferromagnetic thin-film is positioned, exhibits the "magnetic valve effect" if the materials for the ferromagnetic thin-films and the intermediate layers are properly selected and have sufficiently small thicknesses. The resulting "magnetic valve effect" can yield a response which can be several times in magnitude greater than that due to the "giant magnetoresistive effect" in a similar sized cell structure.

An example of a two state magnetoresistive device structure that is generally common to both of these kinds of memory cells is the "pinned sandwich" structure shown in the layer diagram of FIGS. 1A and 1B where the section line of FIG. 1B defines the view shown in FIG. 1A. This layer diagram gives an indication of the structural layers, but is not a true cross section view in that many dimensions there are exaggerated or reduced relative to one another for purposes of clarity.

A substrate, 2, supports an interconnection structure, 3, as the bottom contact electrode to a magnetic material (ferromagnetic material) free layer, 4, (meaning its magnetization is relatively free to be rotated to an alternative orientation) that is separated by a nonmagnetic material spacer layer, 5, from a magnetic material (ferromagnetic material) relatively fixed layer, 6, (meaning its magnetization is much less free to be rotated to an alternative orientation, i.e. "pinned"). This "pinning" of layer 6 is provided by a further magnetic material layer, 7, the "pinning" layer, that is of an antiferromagnetic material which is magnetically coupled to pinned layer 6 and thereby serves to make this two layer pinned structure relatively resistant to rotation of its initial joint magnetization direction in the presence of moderate external applied magnetic fields. An aluminum cap layer, 8, serves as the device top contact electrode providing a conductive path to a further interconnection, 9.

If spacer layer 5 is an electrical conductor, such as Cu, then the structure will exhibit the giant magnetoresistive (GMR) effect and be termed a "spin valve". If spacer layer 5 is an electrical insulator, such as $Al_2O_3$, that is sufficiently thin, then the device will exhibit the spin dependent tunneling effect and be termed a "magnetic tunnel junction". In either situation, the electrical resistance of the device is typically higher when the magnetizations of the free and fixed layers on either side of the spacer layer are oriented antiparallel to one another, and is lower when these magnetizations are oriented parallel to one another. The electrical resistance versus external applied magnetic field response characteristic for a spin valve that is measured for sense current being established across the magnetic material layers with the conductive layer therebetween is greater in terms of fractional change than that characteristic measured for the sense current established parallel to these layers because the entire collection of spins in the sense current electrons is forced to interact with both magnetic material layers for the sense current being established across these layers but only a fraction of these electrons interact with both layers for sense currents established parallel thereto.

Plots of the high externally applied magnetic field range and the low externally applied magnetic field range response characteristics of a typical spin valve are shown in the graphs of FIGS. 2A and 2B, respectively. The device resistance versus externally applied magnetic field response characteristics of a magnetic tunnel junction are qualitatively similar. However, the magnitudes of the resistance values and the resistance change values may be quite different. FIG. 2B shows that at moderately high positive externally applied magnetic fields the device resistance is largest, corresponding to the antiparallel alignment of the magnetizations of free and fixed layers 4 and 6; and the device resistance is smallest for moderately high negative externally applied magnetic fields, corresponding to the parallel alignment of the magnetizations of free and fixed layers 4 and 6.

FIG. 3 shows a graph in which the resistance of the device of FIG. 1, either with a conductive or an insulative spacer layer 5, as an approximate fraction of its maximum resistance versus the angle between the magnetizations of free and fixed ferromagnetic layers 4 and 6 on either side of this spacer layer. This relationship is obtained by applying an external magnetic field along the direction indicated by the angle that is larger than the magnetic saturation field of free layer 4 but less than the magnetic saturation field of fixed layer 6.

As stated above, operating magnetic fields imposed externally can be used to vary the angle of the magnetization vector with respect to the easy axis in the ferromagnetic films of these various kinds of memory cell devices, particularly the free layers. Such operational magnetic fields imposed externally can be used to vary the angle to such an extent as to cause switching of the layer magnetization vector between two stable states which occur for the magnetization being oriented in opposite directions along the easy axis of the layer, the state of the cell determining the value of the binary bit being stored therein. One of the difficulties in such memories is the need to provide memory cells therein that have extremely uniform switching thresholds and adequate resistance to unavoidable interjected magnetic field disturbances in the typical memory cell state selection scheme used. This externally applied operating fields scheme is based on selective externally imposed magnetic fields provided by selectively directing electrical currents over or through sequences of such cells thereby giving rise to such magnetic fields so that selection of a cell occurs through coincident presences of such fields at that cell.

In such a coincident current selection arrangement, only that cell in the vicinity of the crossing location, or intersection, of these two paths (one over a sequence of cells and the other through another sequence of cells) experience sufficient magnetic field intensities due to the summing of the fields due to these two currents to cause such a magnetic state change therein. Cells in the array that are located far away from both of these two current paths are not significantly affected by the magnetic fields generated by such currents in the paths because such fields diminish in intensity with distance from the source thereof. Cells, however, located in relatively close proximity to one, but not two, of these two paths do experience more significant magnetic fields thereabout, and those immediately in or adjacent to one such path experience sufficient field intensities to be considered as being "half-selected" by the presence of current in that path intended to participate in fully selecting a different cell along that path at the intersection with the other path on which a selection current is present. Half-selection means that a bit is affected by magnetic fields from the current through one path but not another. Such a coincident interjected magnetic fields memory cell state selection scheme is very desirable in that an individual switch, such as that provided by a transistor, is not needed for every memory cell, but the limitations this selection mode imposes on the uniformity of switching thresholds for each memory cell in a memory make the production of high yields difficult.

As such magnetic thin-film memory cells are made smaller to thereby increase the cell density over the surface of the substrate on which they are disposed, the resulting cells become more subject to magnetic state, or data, upsets due to thermal fluctuations occurring in the materials therein. The depth of the energy well in the magnetic material of such cells can be approximated as $H_{weff}*M_s*$Volume, where $H_{weff}$ is half the effective restoration magnetic field attempting to maintain the current magnetic state following perturbations thereto and so effectively providing the energy well depth, $M_s$ is the saturation magnetization of the magnetic material in the cell, and Volume is the volume of the magnetic material in the cell. In conventional cells, $H_{weff}$ is provided by shape anisotropy or anisotropy due to the material properties of the cell magnetic material, or both. Typically, the value of $H_{weff}$ in these cells is less than 100 Oe.

Plotting the magnetostatic energy of a data storage cell magnetic material layer versus the angle between the magnetization and the easy axis of that layer, an energy minimum is seen in the result at the angular value of zero or, with this angle designated as θ, at θ=0 as shown in the graph of FIG. 4. This minimum, having on either side thereof in this plot an energy maximum, that is energy maxima at θ=+90° and θ=−90°, is the "energy well". The depth of the energy well when no external magnetic fields are applied is simply the difference between the energy minimum and maxima. The value of this energy well can be calculated from $$E = \tfrac{1}{2} \sin^2\theta |\vec{M}| H_k V$$

where $\vec{M}$ is the magnetization, $H_k$ is the anisotropy field, V is the volume, and θ is the angle of $\vec{M}$ from the easy axis. The magnetization orientation will tend to orient to minimize the magnetostatic energy; i.e., θ will tend toward zero degrees. The graph of FIG. 5 shows a Stoner-Wohlfarth switching threshold plot, a portion of an asteroid, and reasonable values of the word and sense fields to provide adequate margins for a memory employing coincident current selection. The solid curve in the figure represents the total field required to cause a bit magnetization to switch from one to the other of two stable states. The total field is the vector sum of the word magnetic field $\vec{H}_w$ due to current provided in an adjacent word line, and the sense magnetic field $\vec{H}_s$ due to current provided through the cell which currents are typically applied along current paths following the two orthogonal axes in the plane of the cell array. The Gaussian curve portion shown in the middle of the plot is representative of the distribution of cell applied magnetic field switching threshold values in an array of real memory cells. The memory array design, then, must account for the varying cell switching thresholds encountered in view of this distribution. As illustrated in the figure, design values for the word and sense fields are about ½ the value of $H_k$. The remaining energy well depth of those cells half-selected is about ¼ their non-selected depth. This can be shown through calculating the well depth with half selection magnetic fields both present and absent.

The energy expression above, when modified to include the effects of $\vec{H}_w$ and $\vec{H}_s$, becomes $$E = \tfrac{1}{2} \sin^2\theta |\vec{M}| H_k V - |\vec{M}||\vec{H}_s| V \sin\theta + |\vec{M}||\vec{H}_w| V \cos\theta.$$

Here we assume that $\vec{H}_w$ is parallel to the effective easy axis while $\vec{H}_s$ is perpendicular to this axis. The easy axis is parallel to $H_k$.

If a half-select word field is applied (i.e. $|\vec{H}_w|=\frac{1}{2}H_k$ and $|\vec{H}_s|=0$), the energy expression becomes:

$$E=\tfrac{1}{2}\sin^2\theta|\vec{M}|H_kV+|\vec{M}||\vec{H}_w|V\cos\theta,$$

where the second term is the energy due to the applied word field. If a half-select sense field is applied (i.e. $|\vec{H}_s|=\frac{1}{2}H_k$ and $|\vec{H}_w|=0$), the energy expression becomes:

$$E=\tfrac{1}{2}\sin^2\theta|\vec{M}|H_kV-|\vec{M}||\vec{H}_s|V\sin\theta,$$

where the second term is the energy due to the applied sense field.

These two equations are plotted in the graphs of FIGS. 6A and 6B. In both cases, the well depth has been reduced by a factor of four, from $\frac{1}{2}MH_kV$ to $\frac{1}{8}MH_kV$. A physical memory may be designed with slightly different parameters. However, the important factor is the smallest energy well depth for a half-selected cell. The design objective is to ensure that the memory cells are magnetically stable during the data storing, or magnetic state switching, procedure that is repeatedly undertaken with respect to other cells. However, the trade-off between thermal stability and magnetic stability is a serious problem when the total magnetic volume of bits is less than about $10^5$ nm$^3$.

Consider, for instance, a 256 megabit data storage capacity memory cell array provided as part of a monolithic integrated circuit chip organized so as to have 16 byte data blocks (8×17 binary bits) and having implemented therein the well known Hamming single bit error correction code which adds 8 additional bits. A reasonable sub-array to operate would be organized so that the word lines would each be immediately adjacent to 1088 cells to provide magnetic fields thereabout and the sense lines would each connect in series 128 cells for storing and retrieving data binary bits. The data is to be accessed in sequence in two byte groups.

A worst case can be taken to occur if one block had the data therein retrieved continuously for a year. In this case only one block would experience error correction while the remaining 2 million blocks would not. A total of 78 blocks (64-1 +16-1) would be continuously half selected. The unselected blocks with 4 times the well depth can be ignored because their thermally induced failure rate would be negligible.

First, consider the situation without any error correction. For randomly occurring failures in a non-redundant system, reliability theory shows that the total failure rate of the 78 half selected blocks is the sum of the individual failure rates. Also each byte that is present in a block is accessed only $\frac{1}{8}$ of the time. Thus to achieve a desired $10^{-5}$ yearly failure rate for the memory, the failure rate for each cell per $\frac{1}{8}$ year is given by $$10^{-5}/(78\text{ blocks}*128\text{ cells/block})=1.0016\times10^{-9}\text{ failure}/(\tfrac{1}{8}\text{ year}).$$

Noting that there are $3.942*10^6$ seconds in $\frac{1}{8}$ year, that the relaxation time for a magnetic element of the type considered is about $0.5\times10^{-9}$ seconds with the energy state being randomized with respect to each relaxation time ($t_r$) so that there are $1/t_r$ chances to fail per second, and that if a cell is thermally excited above the barrier, there is a 50% chance it will end in the wrong state, one can compute the required energy barrier height ($E_b$) as $$1.0016\times10^{-9}=0.5*e^{-(E_b/kT)}*3.942*10^6*1/(0.5*10^{-9})$$

or $$E_b=56.6\text{ kT}.$$

If there is single bit error correction, then any single bit error in any half-selected block can be corrected and a failure occurs at the end of the year only if two or more errors occur in a block. For small failure probabilities, the failure rate for two or more elements failing in a block is only very slightly more than two elements failing in a block. For convenience, calculations will be based on two bits failing in a block.

Let "f" be the cell failure probability for an element for a year. Using the fact that the number of ways 2 elements can be selected out of 138 is given by $138\times137/2$, the required value of f can be calculated as follows:

$$10^{-5}/(78*69*137)=f^2;\ f=0.3683*10^{-6}$$

The required well depth can then be computed directly as follows:

$$0.3683*10^{-6}=0.5*e^{-(E_b/kT)}*3.942*10^6/((0.5*10^{-9})$$

[half select] $E_b=50.7$ kT [unselect] $4*E_b=203$ kT

Incidentally, if the memory has data retrieved from all of the cells therein every 10 hours and corrections made thereto, the required well depth would be reduced by only a relatively a small amount to 47.3 kT.

Taking the more conservative value of $E_b=28$ kT for unselected memory cells, and assuming the temperature of a half selected cell rises to 400 K during the writing procedure of another cell, and that the saturation magnetization of the storage layer is about 10,000 emu/cm$^3$, and the effective anisotropy of the storage layer is 20 Oe, the minimum volume required to maintain thermal stability is given by the difference between the maximum and the minimum energy values, which occur at $\theta=0$ and at $\theta=\pi/2$, through the following relationship:

$$\tfrac{1}{2}\sin^2\theta\vec{M}\vec{H}_kV=228\text{ kT};$$

$$V=2*228(1.381\times10^{-23}\text{ Joules/Kelvin})(400\text{ Kelvin})/(10{,}000\text{ emu/cm}^3)(20\text{ Oe})=12.6*10^{-24}\text{ m}^3=12{,}600\text{ nm}^3.$$

Because of the exponential nature of the threshold, or energy barrier, unselected cells do not contribute significantly to the error rate. Changing the number of half selected cells by a factor of 10 only changes the energy barrier height requirement by 2.3 kT. Although the required barrier energy can be reduced by use of error correction and periodic retrievals with corresponding corrections of the data stored in the whole memory, such a memory takes additional chip area and increased processing steps thereby increasing costs and reducing operating rapidity.

As an example, consider first a memory cell from FIG. 1 with a 0.2 μm width having ferromagnetic free layer element 4 therein of that same width as depicted in that figure. This cell is to be configured to meet the well depth requirements at a temperature of 85° C., i.e. have the necessary half select energy well in the magnetic material, approximated as $H_{weff}*M_s*\text{Volume}$, where again $H_{weff}$ is half the effective restoration magnetic field attempting to maintain the current magnetic state following perturbations thereto or $H_k/2$. In meeting this requirement, ellipsoid shaped like free layer 4 has outer dimensions chosen to be 0.2 μm wide, as indicated above, and to have a length of 0.5 μm so as to have a length to width ratio of n=2.5, with the result that it can the requirement by being provided either of a ternary alloy (65% Ni-15% Fe-20% Co, $M_s$=1000 emu) with a thickness of 23.5 Å and a total anisotropy field of 130 Oe or alternatively of a permalloy (80% Ni-20% Fe, $M_s$=800 emu) with a thickness of 31 Å and an anisotropy field of 124 Oe. In this example, free layer 4 being of such a permalloy is considered in the following.

Assuming that the memory cell is a spin dependent tunneling memory cell, and so having nonmagnetic layer 5 being an electrical insulator to thereby form a magnetic tunnel junction between free layer 4 and pinned layer 6, the cell can be fabricated with free layer 4 directly deposited on a polished, 400 Å thick, copper sense line serving as interconnection structure 3 extending along its length. This sense line is in turn separated by 500 Å of silicon dioxide from a word line therebelow extending along its width. (In a GMR device with nonmagnetic layer 5 being an electrical conductor, the copper sense line would be broken to allow at least free layer 4 to be electrically connected in series with this sense line.) In such a spin dependent tunneling cell structure, the sense current required to generate a 62 Oe half select field is 2.37 mA and the temperature rise from this sense current is 5.3° C. assuming a thermal conductivity for silicon dioxide of 0.014 W/(° C. cm) and a copper sheet resistance of 0.75 Ω/□. For a 0.25 μm thick copper word line clad with 250 Å of permalloy to increase the word field, a current of 3.95 mA is required to generate a 62 Oe word field. With 500 Å of silicon dioxide insulation to the silicon substrate, the temperature rise is less than 0.2° C. for the word line. Current density for the sense line is $3\times10^7$ A/cm$^2$ and the current density for the word line is $3.2\times10^6$/cm$^2$.

Now consider the result of having the dimensions of this cell reduced through dividing them by some scaling factor greater than one to thereby allow increasing the density of cells in the memory chip. Then thermal stability requires that the energy well depth remain constant or that $H_k M_s V$=const. Since the same permalloy material will be assumed to be used for the shrunken free layer, $M_s$ will remain the same and so maintaining $H_k V$ constant becomes necessary. However, $H_k$ due to shape anisotropy, which is dominant in small dimension layers, can be written as $C_1 t/w$ where $C_1$ is a constant, t is the free layer thickness and w is the free layer width, and the volume $V=C_2(nw)wt$ where $C_2$ is a constant accounting for the ellipsoidal shape and n, as above, is the cell length to width ratio thus allowing the volume to be written $C_2 w^2 t$ by absorbing the constant n into the constant $C_2$. Thus, $H_k V=(C_1 t/w) C_2 w^2 t = C_1 C_2 t^2 w = C_3$. Hence, the initial and scaled values of the product $t^2 w$ must equal one another, or $t_i^2 w_i = t_s^2 w_s$, so that a scaling of the width and length by a factor k giving $w_s = w_i/k$ requires the scaled layer thickness to become $t_s = \sqrt{k} t_i$ with the result that the scaled cell anisotropy field $H_k$ becomes $C_1 k \sqrt{k} t_i/w_i = C_1 k^{3/2} t_i/w_i$, or alternatively, the thickness t must be varied in any such scaling as $C_3/\sqrt{w}$ to maintain $H_k V$ constant.

The result, for a scaling factor of two for example, is that the thickness of free layer 4 increases roughly by a factor of the square root of two and the anisotropy field thereof increases roughly by a factor of two times the square root of two. As the external magnetic fields to switch the free layer magnetization are based on providing such fields with magnitudes on the order of $H_k/2$, and as the path integral around the conductor carrying the current to supply such a field is proportional to that current, the necessary current I in milliamps can be found from $H_k/2=(C_1/2)k^{3/2}t_i/w_i=0.4\pi I[(2w_i/k)+2\sqrt{k}t_i]$ where the terms in the brackets represent the path length around the conductor as a result of the scaling. This expression can be written $(C_1/2)k^{3/2}=0.4\pi I[(2w_i^2/kt_i)+2\sqrt{k}w_i]$ so that using, from above, $t_i=C_3/\sqrt{w_i}$ yields $(C_1/2)k^{3/2}=0.4\pi I[(2w_i^{5/2}/kC_3)+2\sqrt{k}w_i]$. Thus, the current resulting from scaling is $I=(C_1/2)k^{3/2}/0.4\pi[(2w_i^{5/2}/kC_3)+2\sqrt{k}w_i]$ showing that the current I increases with the scaling factor as the width becomes correspondingly smaller. Thus, in this example of a scaling factor equaling two, the sense current through the free layer increases roughly by a factor of the square root of two. As a result, the current density in the layer after scaling, $I/[(w_i/k)(\sqrt{k}t_i)]$, and the temperature rise in the scaled layer due to $I^2R$ heating therein, $I^2\rho n w_i/[(w_i/k)(\sqrt{k}t_i)]$ where ρ is the layer resistivity, increase roughly by a factor of four times the square root of two.

Thus, to meet the thermal stability requirement of maintaining the same energy well depth, the thickness of the resulting 0.1 micron wide free layer 4 in the scaled down cell must be increased to 45 Å. The total anisotropy field becomes 340 Oe and the required sense line current becomes 3.25 mA and the required word line current becomes 4.75 mA. Current density in the sense line increases to $1.63\times10^8$ Å/cm$^2$ and temperature rise in the line increases to 40° C. These results show the very dramatic increase in current density as elements are reduced in width so that electromigration in the current conductors along with heating must be considered.

As indicated above, a ferromagnetic layer and an antiferromagnetic layer can be deposited in succession so they are in contact with one another with the result that relatively large interatomic forces occur aligning electron spins (parallel for ferromagnetism and antiparallel for antiferromagnetism). These coupling forces at the interface between these layers can be such that the magnetization of the ferromagnetic layer is restored to its initial direction prior to being subjected to external magnetic fields even after very large external magnetic fields are subsequently applied thereto. Such external magnetic fields can be 1000 Oe or more, and the magnetization of the ferromagnetic layer will still be restored to its initial direction. Thus, if such an antiferromagnetic layer is provided in contact with a ferromagnetic layer in a memory cell so that relatively large coupling occurs therebetween, the energy well depth for a small memory cell can be greatly increased. Such an arrangement can increase the potential density of memory cells by more than a factor of 10 through permitting the cell dimensions to go from about 0.2 μm minimum dimensions to approximately 0.05 μm dimensions.

A film structure which exhibits even better resistance to the effects of large externally applied magnetic fields is provided by a compound ferromagnetic thin-film layer with an antiferromagnetic layer. This compound ferromagnetic thin-film layer is provided to have a net layer magnetization that, when fixed in orientation in the finally formed structure, will resist rotation of its magnetization so that the magnetization of this compound ferromagnetic thin-film layer will appear fixed in its orientation in the device, i.e. "pinned" in a direction relative to the finally formed structure.

This compound ferromagnetic thin-film layer is formed by depositing a ferromagnetic layer to perhaps a thickness of 40 Å which is deposited in the presence of an easy axis direction determination magnetic field, then a nonmagnetic layer of ruthenium (no orienting magnetic field needed in this instance) to provide a ruthenium antiferromagnetic coupling layer of 9 Å thickness. Thereafter, another ferromagnetic layer is deposited to a thickness of 40 Å again in the presence of an easy axis direction determination magnetic field aligned as was the field for the first ferromagnetic layer. The resulting compound ferromagnetic layer has materials with high spin polarization in its outer layers due to the use of high magnetic induction ferromagnetic material therein, but has little net magnetic moment because of the ruthenium layer provided therebetween which strongly antiferromagnetically couples these outer layers through primarily exchange coupling (some magnetostatic coupling also present) so that the magnetizations of each are pointed in opposite directions. Thus, this layer is relatively insensitive to externally applied fields and contributes little to the spatial fields thereabout. However, the magnetization direction in this composite layer by itself is not very strongly fixed in any direction because of the relatively weak anisotropy exhibited by the ferromagnetic layers.

Thus, a further antiferromagnetic material "pinning" layer exhibiting a substantial magnetic anisotropy must be deposited on the last ferromagnetic layer to strongly set the magnetization direction of the compound layer. Such an antiferromagnetic layer has a strongly fixed magnetization direction which, through exchange coupling to the last ferromagnetic layer on which it is deposited, strongly fixes the direction of magnetization of that layer also, and so that of the first ferromagnetic layer through the ruthenium layer. The result is an antiferromagnetic layer coupled strongly to the compound layer. Hence, an antiferromagnetic pinning layer is deposited on the last ferromagnetic layer to a thickness of 100 Å or more in the presence of a magnetization axis determination magnetic field aligned with the fields used in forming the two ferromagnetic layers.

If this compound ferromagnetic layer with the antiferromagnetic layer thereon is provided across an electrically conductive layer of perhaps 25 Å thickness from a further ferromagnetic layer of again 40 Å thickness, a good "spin-valve" magnetoresistive memory cell is formed in which this last ferromagnetic layer is the "free" layer which can have its magnetization changed to be either parallel or antiparallel to the firmly fixed magnetization direction of the nearest ferromagnetic layer in the compound ferromagnetic layer to select one of the possible the cell magnetization states (the different states resulting in different cell electrical resistances). This can be accomplished through providing a sufficiently large storage electrical current which will flow primarily through the relatively thick conductive layer between the compound ferromagnetic layer and the "free" layer (although some of this current will also pass through these latter two layers also even though being substantially shunted around by the conductive layer). An external magnetic field directed along the storage current path can also be provided through an appropriately positioned current strap to "tip" the magnetization of the "free" layer to reduce the magnitude needed for the storage current to rotate the "free" layer magnetization. A smaller retrieval electrical current can be directed along the cell current path used for the storage current primarily through the conductive layer between the compound ferromagnetic layer and the "free" layer (though again some of this current will also pass through these latter two layers also despite the substantial conductive layer shunting effect).

This common use of the compound ferromagnetic layer with an antiferromagnetic layer thereon is based on its resistance to alteration of its magnetization direction by externally applied magnetic fields. Omitting the antiferromagnetic layer reduces the ability to set the direction of the magnetization in the compound ferromagnetic layer, but whatever magnetization direction results in the compound ferromagnetic layer in the circumstance of no antiferromagnetic layer being present is still, as indicated above, quite insensitive to externally applied magnetic fields if the two ferromagnetic layers therein are well matched in responding to such external fields. This is true since the effect of an external field on one ferromagnetic layer is directly opposed by the effect on the other because of their magnetizations being held strictly antiparallel to one another by the Ru layer therebetween. Thus, use of a compound ferromagnetic layer without an antiferromagnetic layer thereon would also result in the energy well depth for a small memory cell based on this structure being substantially increased due to the demagnetization fields in each ferromagnetic layer being maintained in directions to approximately cancel one another.

The magnetic fields necessary to reach the layer switching thresholds to cause switching of the relatively fixed magnetization orientation layers magnetization directions for memory cells of smaller and smaller lengths and widths to thereby change the data stored therein have, of course, magnitudes beyond those of the fields required to switch the magnetization directions in the free layers of those cells which also increase for smaller cells as shown above. Generating such magnetic fields begins to require currents through such cells and associated word lines of magnitudes that result in current densities sufficient to cause significant electromigration of the conductive materials and operating temperature rises of the cell region which will alter device behavior and structure. Such effects thereby lead to a limit of some minimum size for these cells.

One possibility for avoiding such limits has been found through allowing memory cell device operating temperature increases due to heating because of supplying word line currents adjacent to, and sense currents in, memory cells sufficient to approach or exceed the Curie temperature of the ferromagnetic layers in memory cells without a "pinning" layer or layers therein, or to approach or exceed the blocking temperature of the antiferromagnetic "pinning" layer in cells having such a layer. Such word line and sense line current based temperature increases permit storage of information in those cells to be achieved without reaching current magnitudes otherwise necessary to switch the magnetization directions of the ferromagnetic layers. The direction of magnetization of the relatively fixed magnetization orientation layer such as the thicker ferromagnetic layer in a three layer "sandwich" structure can be selected by having a moderate magnetic field present oriented in the selected direction when the layer cools sufficiently below its Curie temperature for cells without a "pinning" layer present, or by a field sufficient to set the direction of the ferromagnetic layer adjacent an antiferromagnetic "pinning" layer when that "pinning" layer cools sufficiently below its blocking temperature for cells using such a "pinning" layer or, alternatively, a "pinning" layer composite. The blocking temperature of an antiferromagnetic layer is the temperature at or above which that layer loses its ability to "pin" the magnetization direction of an adjacent ferromagnetic layer below its Curie temperature which blocking temperature is usually less than the Néel temperature of that layer. Similarly, the Curie temperature may not need to be fully reached to allow relatively easy reorienting of the magnetization direction therein.

Reducing the magnitudes of currents necessary for causing the harder ferromagnetic layer in memory cells without a "pinning" layer to approach or reach its Curie temperature, or the antiferromagnetic layer in memory cells with a "pinning" layer arrangement to approach or reach its blocking temperature, and insulating such memory cells from their neighboring cells to provide good cell selectivity in storing information requires providing some thermal isolation of each cell from its neighbors and the integrated circuit substrate or any other kind of substrate serving as a heat sink. Such thermal isolation can be provided by use of electrical conductive interconnections that are of a relatively low thermal conductivity, and by supporting the memory cell on an electrical insulator of relatively low thermal conductivity. However, as the need for increased density of magnetoresistance based memory cells supported in and on a monolithic integrated circuit leads to smaller and smaller cell extents, further structural and operational alternatives for such memory cells are desired.

BRIEF SUMMARY OF THE INVENTION

The present invention provides a ferromagnetic thin-film based digital memory having bit structures therein with a magnetic material film in which a magnetic property thereof is maintained below a critical temperature above which such magnetic property is not maintained, and may also have a plurality of word line structures each with heating sections located across from the magnetic material film in a corresponding one of the bit structures. These bit structures are sufficiently thermally isolated to allow selected currents in the adjacent word lines or in the bit structure, including those supplied therein through contacts made to the side of the bit structure closest to the substrate supporting it, or both, to selectively heat the bit structure to approach the critical temperature. Alternatively, pairs of such word line structures can have the members of each be on opposite sides of corresponding bit structures extending in different directions therefrom to allow selected currents therein to selectively heat the corresponding bit structure to approach the critical temperature. Currents can be selected to be supplied coincidently in the adjacent word line and the bit structure, or instead in a further conductor also adjacent the bit structure rather than in that structure, to cause such a temperature rise, and then selectively be reduced to cool the bit structure while supplying a magnetic field during the cooling to select the direction of magnetization to be maintained thereafter until new data is next stored therein. Such bit structures may have three magnetic material layers each with its own critical temperature for maintaining versus not maintaining a magnetic property thereof.

BRIEF DESCRIPTION OF THE DRAWINGS

FIGS. 11A, 11B and 11C represent perspective views of portions of monolithic integrated circuit structures embodying the present invention.

DETAILED DESCRIPTION

The use of magnetic material layers in the structures of magnetoresistive memory cells either in different arrangements or with different critical temperatures, either Curie point or blocking temperatures as appropriate for each pertinent layer in the cell, or use of both of these structural layer alternatives, can allow memory operation with reduced electrical power or provide other advantages, or some combination thereof. Cell operations are typically initiated using a current pulse through the memory cell, or in an electrical conductor of sufficiently high resistance in the vicinity of the memory cell, or both, to generate sufficient heat to raise the temperature of the cell past one or more of these cell layer critical temperatures, and further supplying a suitable magnetizing current at proper times. Such a magnetizing current can be much less than the switching current needed to switch the magnetization direction of a magnetic material layer in an unheated cell.

In such arrangements where memory cell structures have data stored therein in conjunction with selectively heating those structures, the desired rapidity of storage is achieved by using thin isolating layers such as the dielectrics. In thin dielectrics, thermal equilibrium is reached in a very short time. This can be directly calculated by use of the Fourier heat conduction equation and the appropriate material parameters. The temperature rise is given in general by that equation as $$\frac{\partial T}{\partial t} = \frac{k_{th}}{C_p \rho} \left[ \frac{\partial^2 T}{\partial x^2} + \frac{\partial^2 T}{\partial x^2} + \frac{\partial^2 T}{\partial x^2} \right],$$

where T is the temperature, t is the time, $k_{th}$ is the thermal conductivity, $\rho$ is the density, $C_p$ is the specific heat at constant pressure, and x, y and z are the spatial coordinates. The thermal diffusivity constant is given by $$k_d = \frac{k_{th}}{C_p \rho}.$$

In one dimension which is a reasonable approximation with a large heat sink directly below the heating sources, the temperature rise is given by $$\frac{\partial T}{\partial t} = k_d \frac{\partial^2 T}{\partial x^2}.$$

Consider a cell device like that of FIG. 1 but with a one micron wide word line made of 100 Å thick tungsten provided thereover so that such a memory cell located in silicon dioxide 200 Å below this word line, the device positioned over 500 Å of silicon dioxide supported on a substrate therebelow having a silicon integrated circuit therein. The thermal conductivity of silicon dioxide is 0.014 Watts/° C. cm, for tungsten 1.87 watts/° C. cm, and for silicon 1.5 watts/° C. cm. Because the silicon has more than 100 times the thermal conductivity of the silicon dioxide, the silicon in the remaining portions of the substrate can be treated as an infinite heat sink. The volume specific heat for silicon dioxide is 2.27 joules/° C. cm³ and for tungsten is 3.66 joules/° C. cm³. The tungsten line has a resistivity of about 8 Ω/□.

Figure 7:
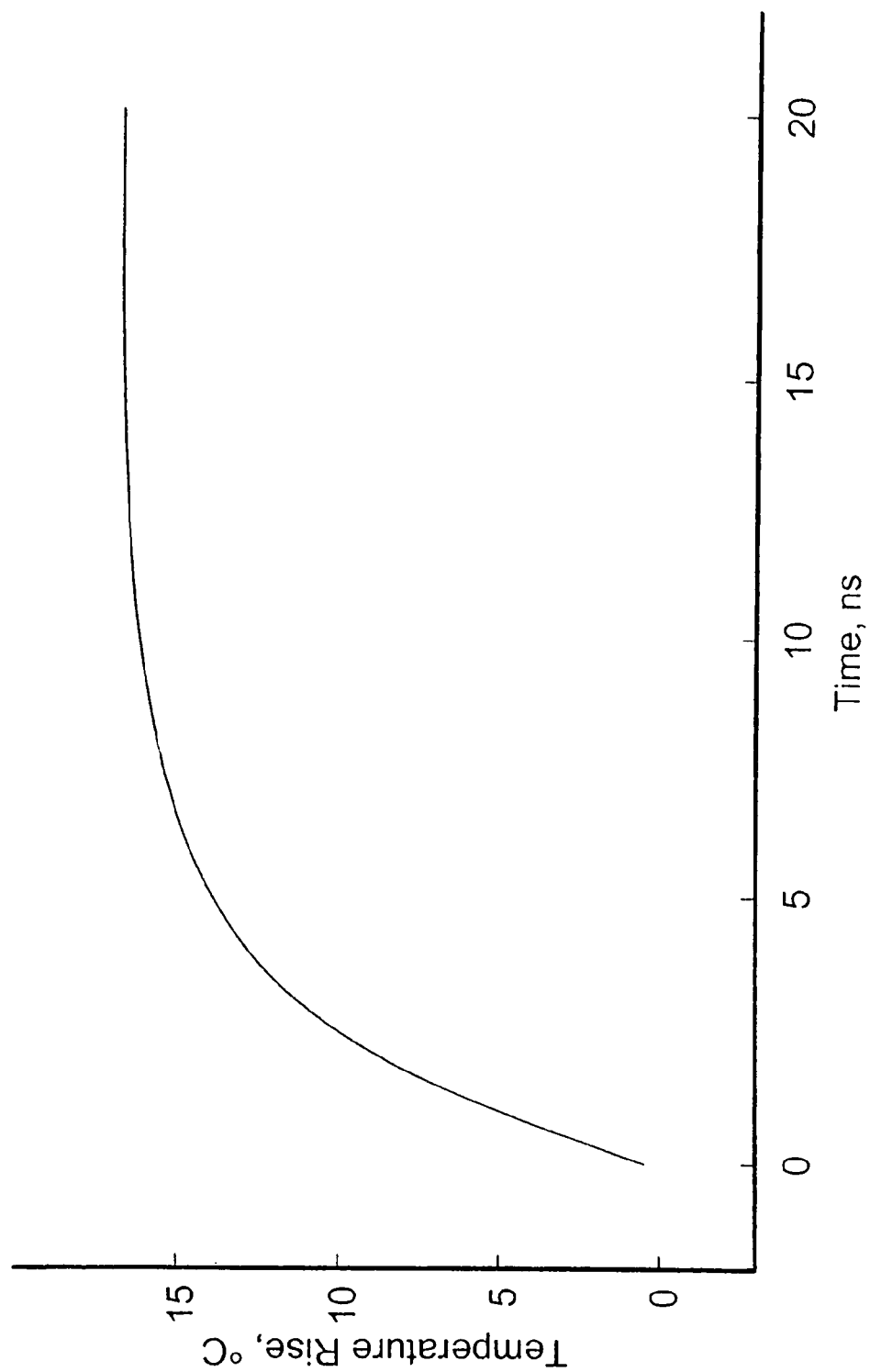

For this example, a 10 mA current was abruptly established in the word line and the temperature transient was determined using the above parameters in a numerical solution of the above on dimension diffusion equation. FIG. 7 shows the 17° C. rise reaching 90% of its final value in 6.5 nanoseconds. Thus, thermal time constants are not a limiting factor in data storage rapidity for sufficiently small versions of the above described memory cells, and will almost always be less, usually much less, than 100 ns.

Figure 8A:
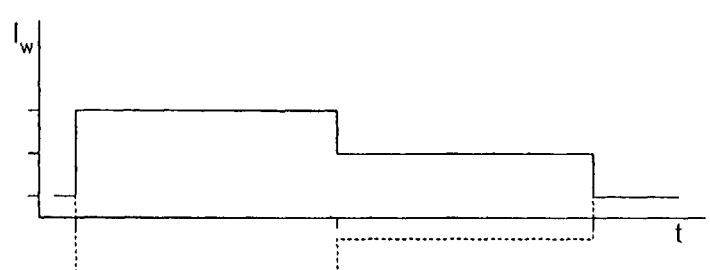

In operation, using coincident pulses in the word current, $I_w$, and in the sense current, $I_s$, to store and retrieve information from these kinds of memory cells, there will be typical waveforms of the kinds illustrated in FIG. 8 corresponding to storage of data based on thermal pulses and FIG. 9 corresponding to data retrieval. In FIG. 8A, a full magnitude current pulse with respect to the initial zero magnitude is applied in the word line adjacent the memory cell in which data is to be stored during the first time period shown. Either a positive current represented by the solid line or, alternatively, a negative current represented by the short dashed line in FIG. 8A can be used depending on the direction of magnetization desired to be stored in the ferromagnetic material associated with the magnetically harder side of the nonmagnetic intermediate layer.

Figure 8B:
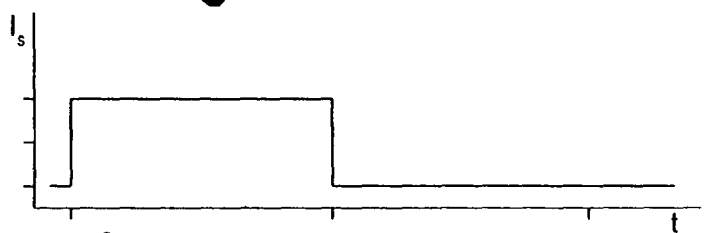

A similar full magnitude current pulse during that first time period is applied through the cell as a sense current as shown in FIG. 8B. Together, the heat generated by these current pulses forces the temperature of the cell up from its ambient value to past either the ferromagnetic material Curie temperature, or the antiferromagnetic material blocking temperature, depending on the kind of cell, as represented by the long dashed line in FIG. 8C. In this situation, the ferromagnetic material associated with the magnetically harder side of the nonmagnetic intermediate layer can relatively easily have the direction of magnetization therein set in the desired direction to hereby store a bit of data therein as described above.

This storage is accomplished by letting the cell cool below the pertinent one of the Curie or blocking temperatures (represented by the long dashed line in FIG. 8C) while maintaining a magnetization direction setting magnetic field. To do so, the word line current in the second time period shown in FIG. 8A is reduced in magnitude by one half with the remaining half magnitude current serving to provide the direction selection magnetic field for the ferromagnetic material associated with the magnetically harder side of the nonmagnetic intermediate layer during this cooling. The magnetization direction selected depends on which direction through the adjacent word line the word line current follows in being either the solid line current or the short dashed line current of FIG. 8A.

Figure 8C:
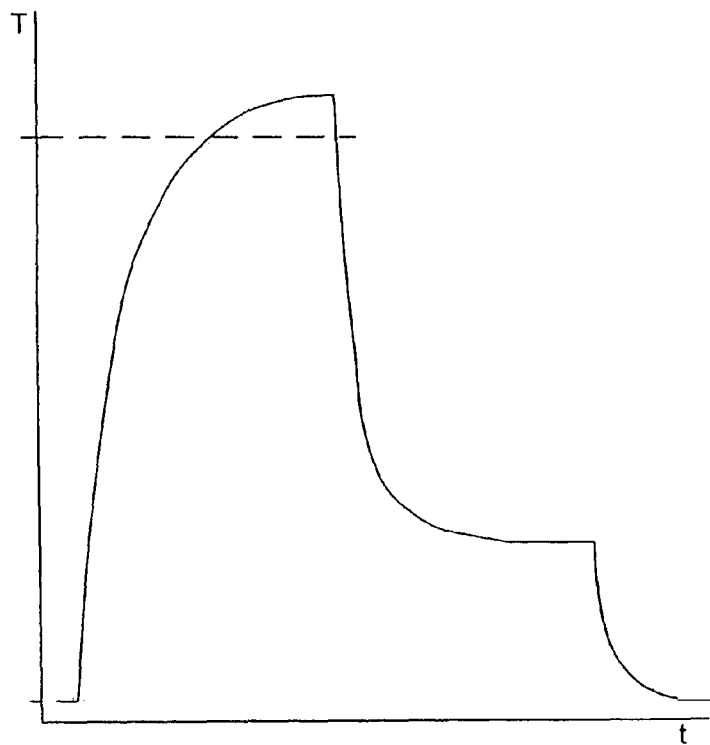

The sense current in the second time period shown in FIG. 8B is reduced to zero to speed cooling. As can be seen in FIG. 8C, the temperature of the cell decreases below the dashed line temperature quickly. Following the second time period shown in FIG. 8A, the word line current is reduced to zero and the cell temperature shown in FIG. 8C falls back to ins ambient value thereby completing the storage operation.

Figure 9A:
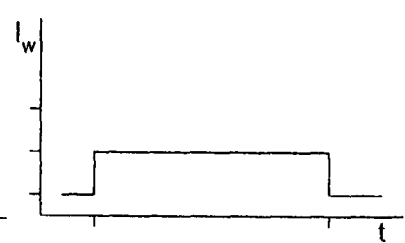
Figure 9B:
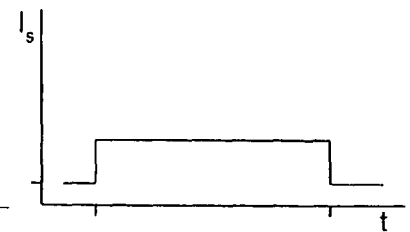
Figure 9C:
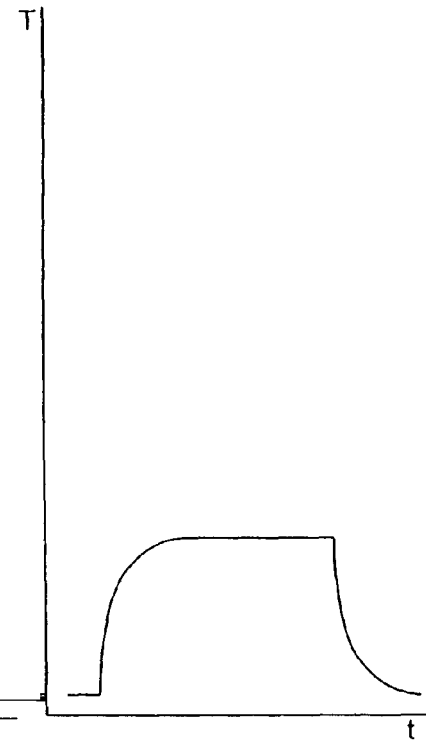

Retrieving information from the same cell as to the direction of magnetization of the ferromagnetic material associated with the magnetically harder side of the nonmagnetic intermediate layer is shown in FIG. 9 to be completed in the one time period shown. A half of the full magnitude current pulse is provided in this time period in both the adjacent word line, as shown in FIG. 9A, and through the cell as shown in FIG. 9B. Retrieval circuitry not shown senses any cell resistance value change to make the determination as to the direction of magnetization of the ferromagnetic material associated with the magnetically harder side of the nonmagnetic intermediate layer to thereby retrieve the data represented by this direction. As shown in FIG. 9C, the cell temperature does not rise significantly since in these circumstances only a quarter of the power is dissipated compared to the power dissipated in the first time period involved with the storing of data shown in FIG. 8A.

Figure 10:
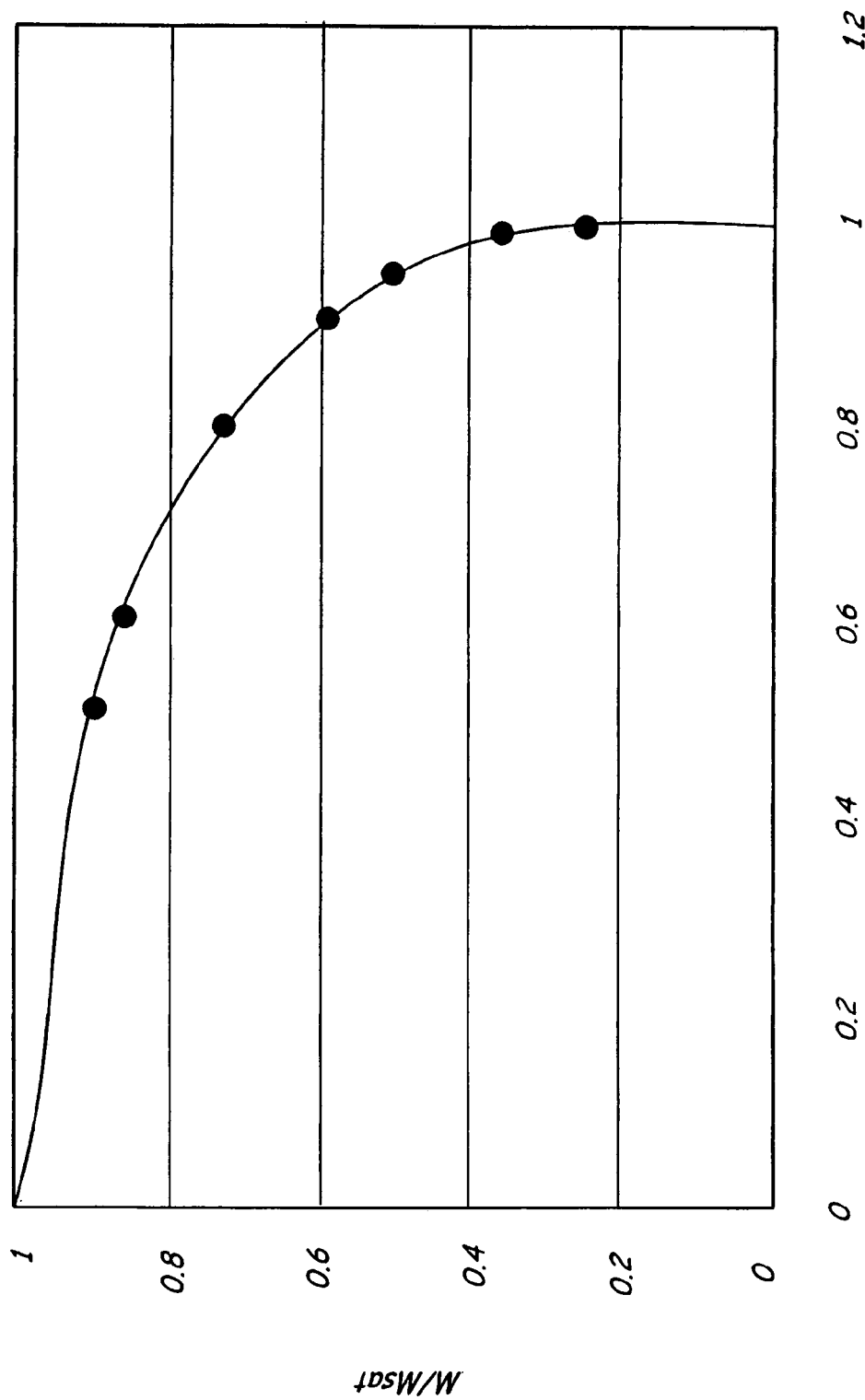

FIG. 10 is a graph in normalized form for a typical ferromagnetic material of the magnetization thereof, normalized through using the material magnetic saturation as the normalizing factor, versus temperature of the material normalized through using the material Curie temperature as the normalizing factor. As the thermal energy increases with temperature, it begins to overwhelm the magnetic anisotropy energy of the ferromagnetic material until the summed atomic magnetic moments of the material sample is zero due to the thermal randomization of those magnetic moments.

Figure 2A:
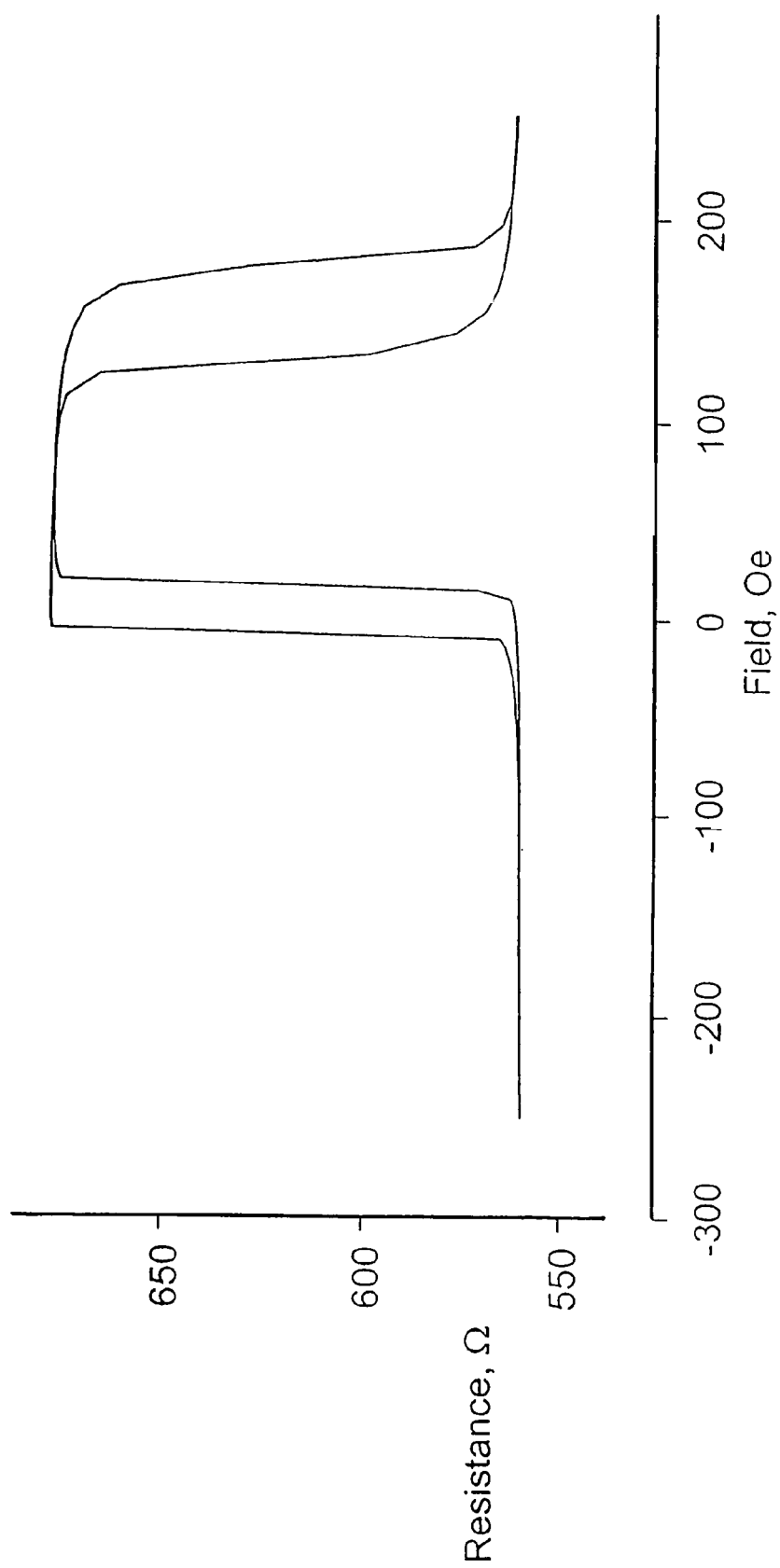
FIGS. 2A and 2B represents graphs of a response for a structure similar to one of those shown in FIGS. 1A and 1B and other structures herein.

Returning to FIG. 2A for these circumstances, the graph shows the major resistance versus applied external magnetic field characteristic for a "pinned" layer spin dependent tunneling memory cell having the maintained magnetization direction oriented in one direction along the length of that cell. A mirror image characteristic, i.e. essentially the same characteristic as shown in FIG. 2A rotated about the resistance axis, results for a maintained magnetization direction oriented in the opposite direction along the length of that cell. During the storage of data therein, however, these characteristics are transformed as the blocking temperature for the "pinning" layer is reached by either essentially collapsing if the blocking temperature exceeds the Curie temperature of the adjacent ferromagnetic layer or reverting to the major resistance versus applied field characteristics of just the ferromagnetic layers if it does not.

Figure 2B:
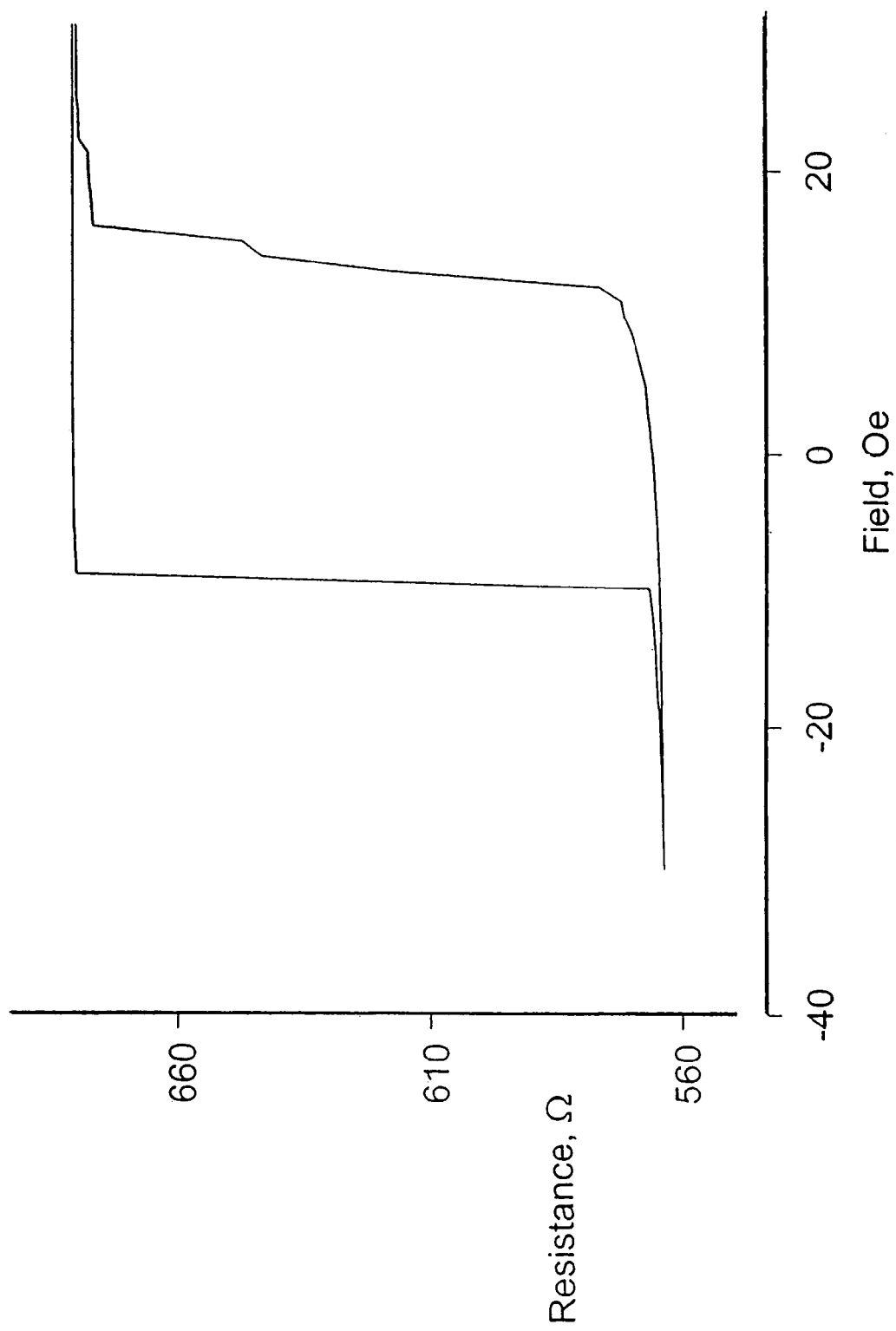
Figure 3:
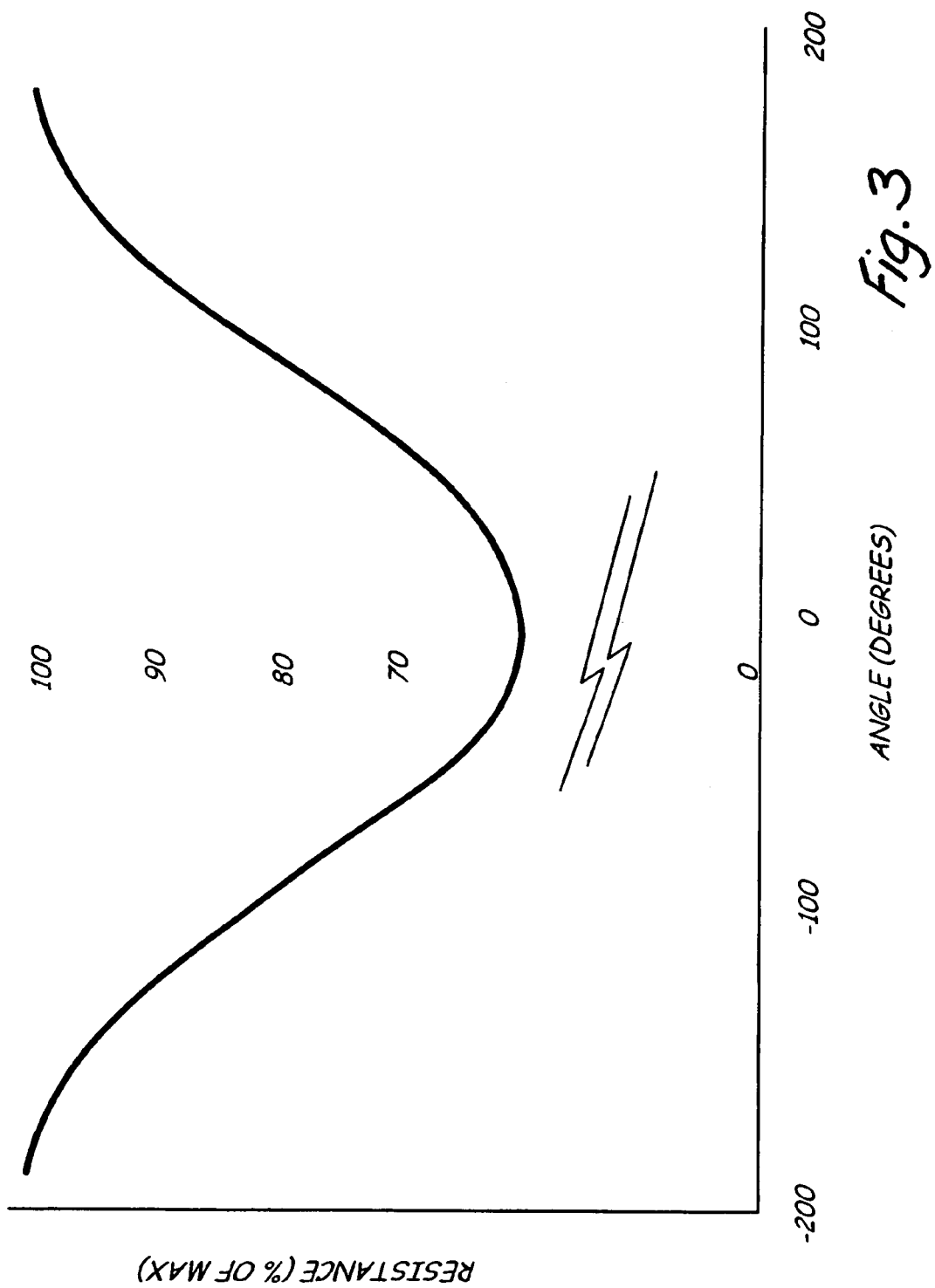
FIGS. 3, 4, 5, 6A and 6B, 7, 8A, 8B and 8C, and 9A, 9B and 9C, and 10 represent graphs of conditions and response for structures described herein.
Figure 4:
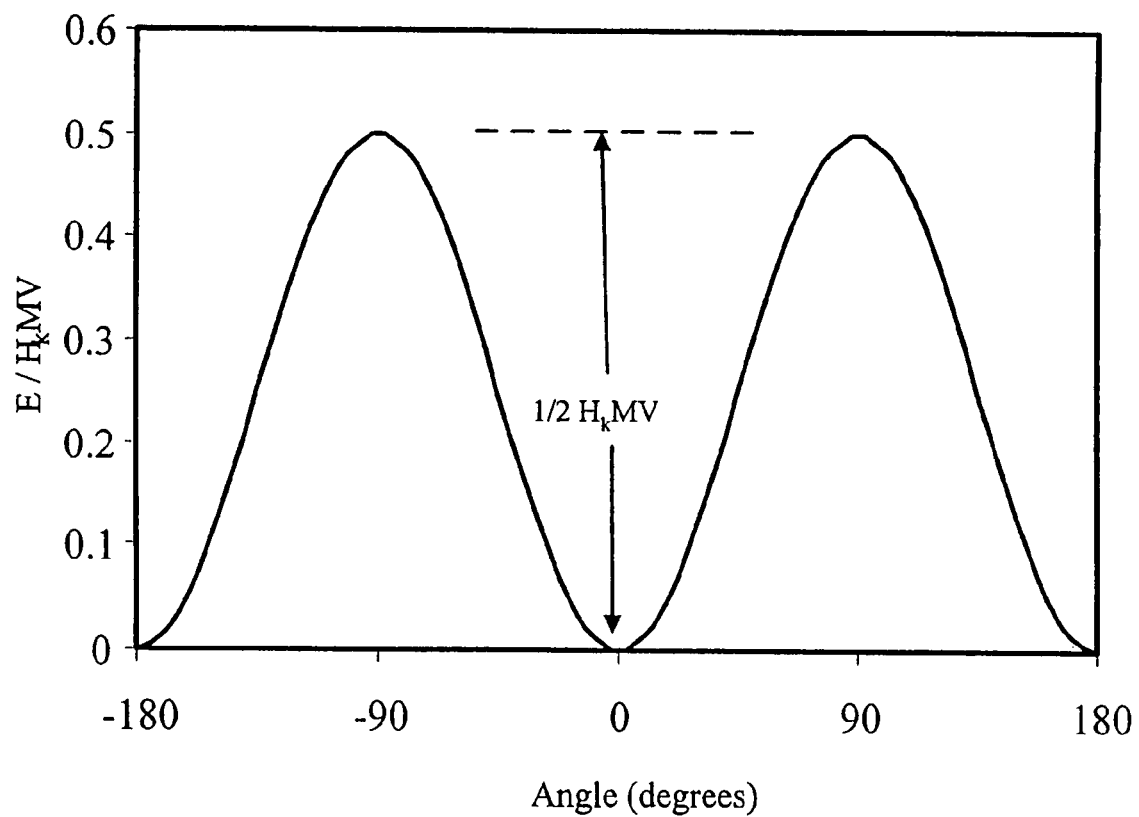
Figure 5:
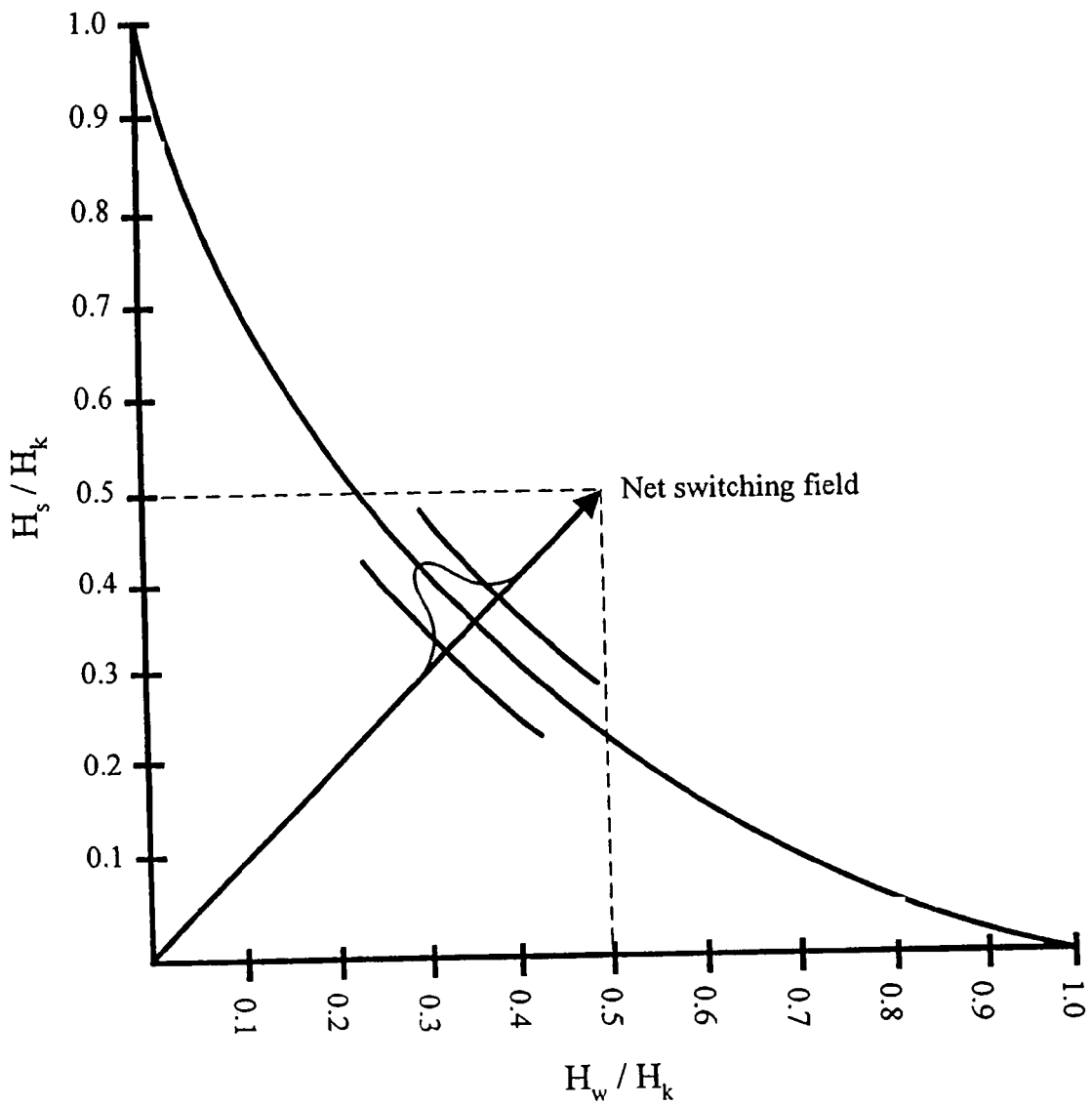
Figure 6A:
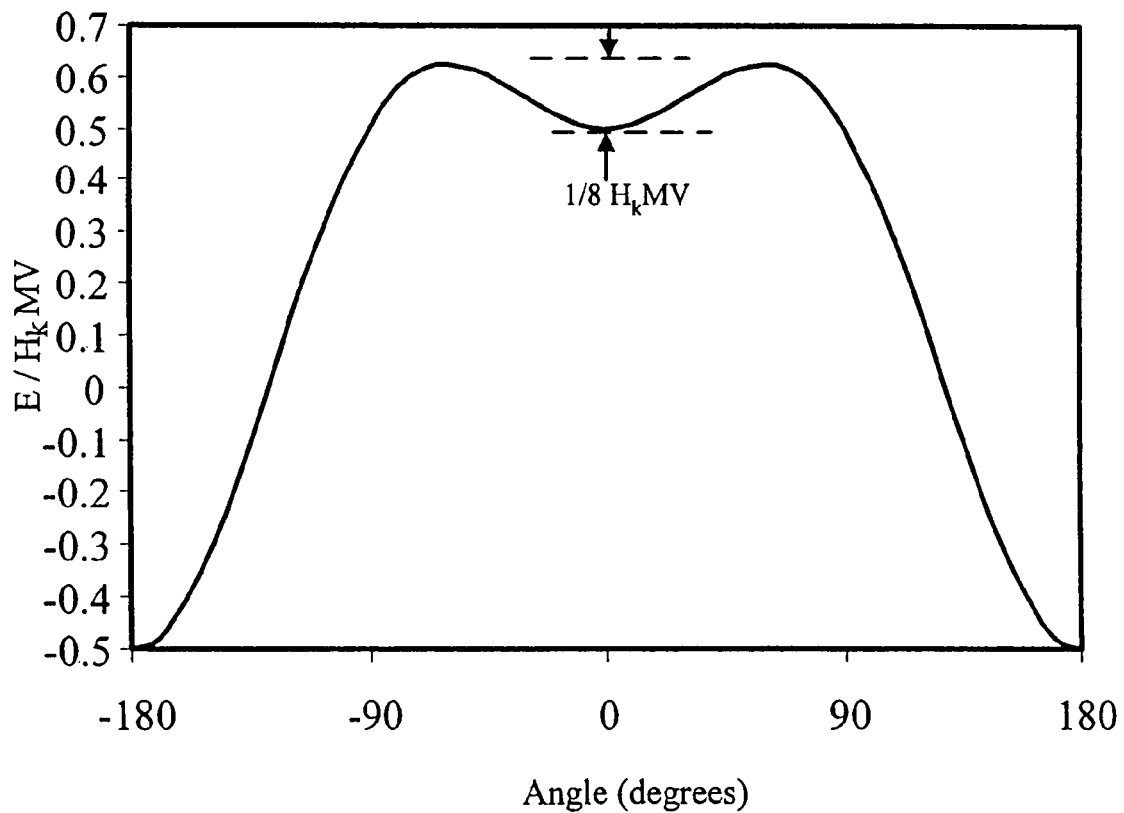
Figure 6B:
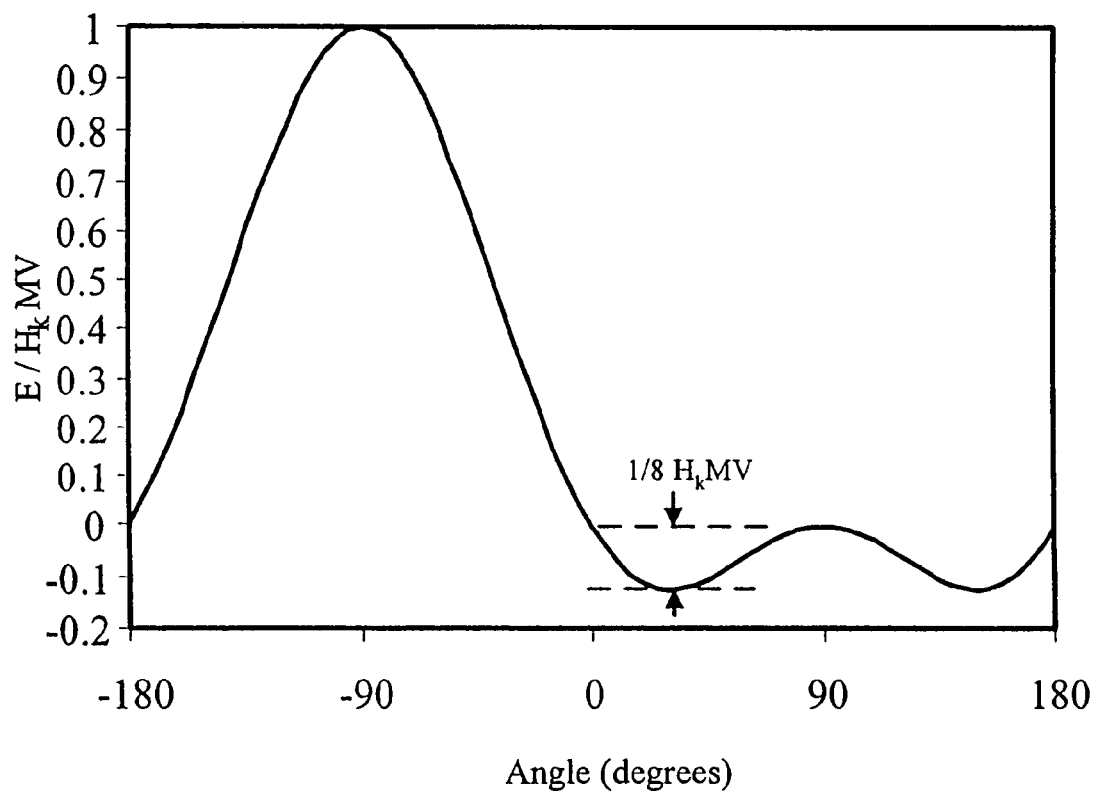

During retrieval of data from this memory cell, field magnitudes only relatively near zero are applied to these characteristics so that the operating point moves from one to the other of the two resistance lobes shown in FIG. 2A. This behavior effectively results in a minor loop characteristic for retrieval purposes as is shown in FIG. 2B.

Figure 1B:
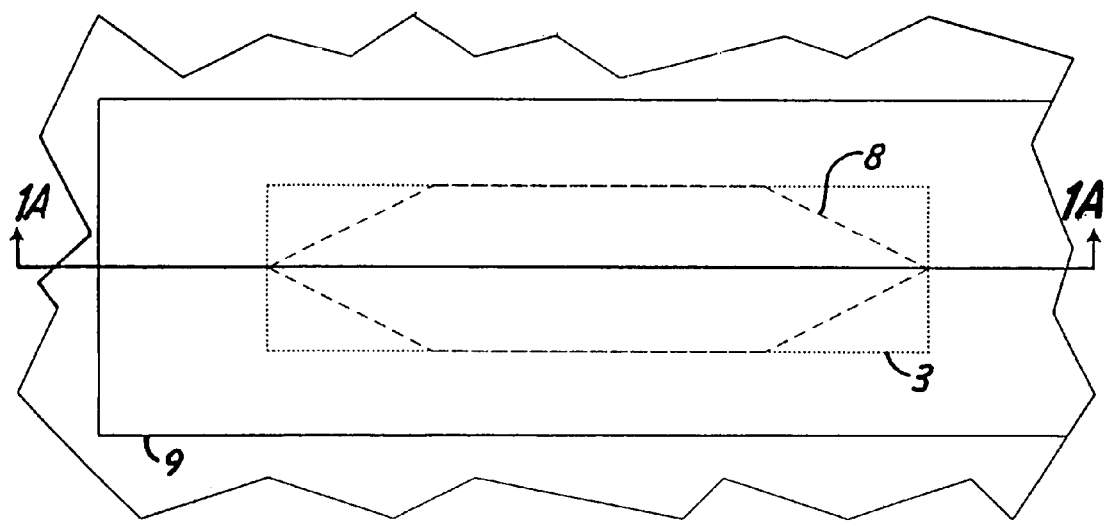
FIGS. 1A and 1B represent a layer diagram of a portion of monolithic integrated circuit structure.
Figure 1A:
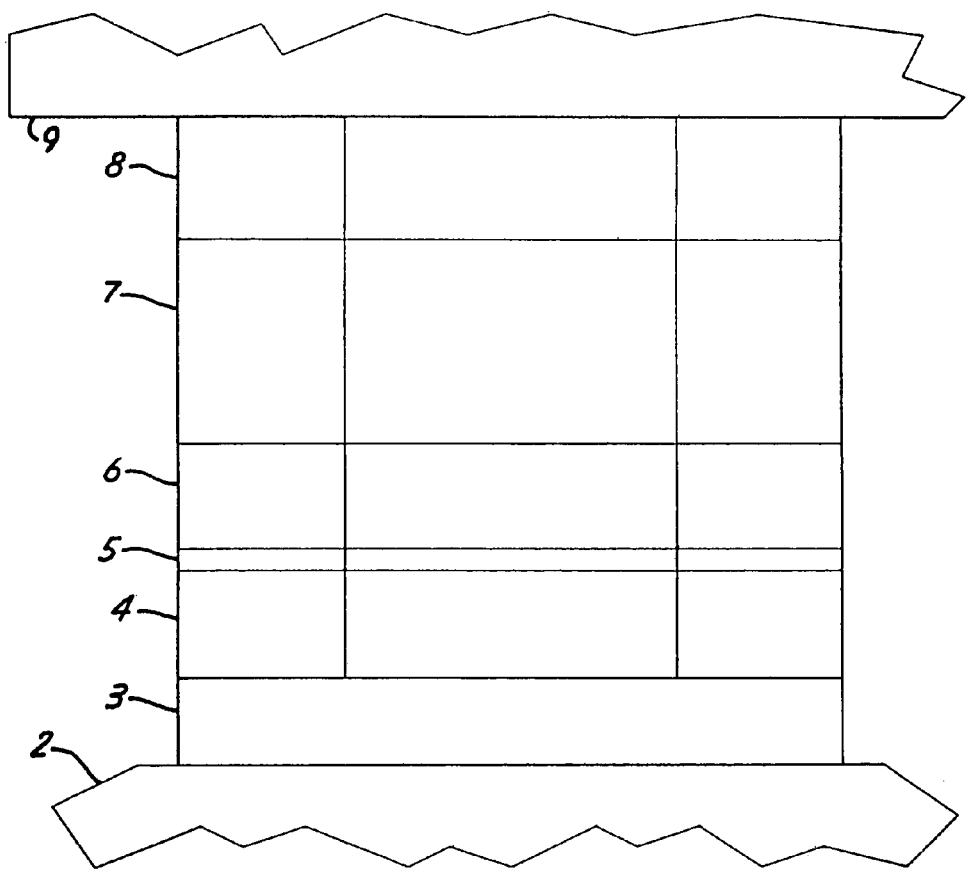
Figure 11C:
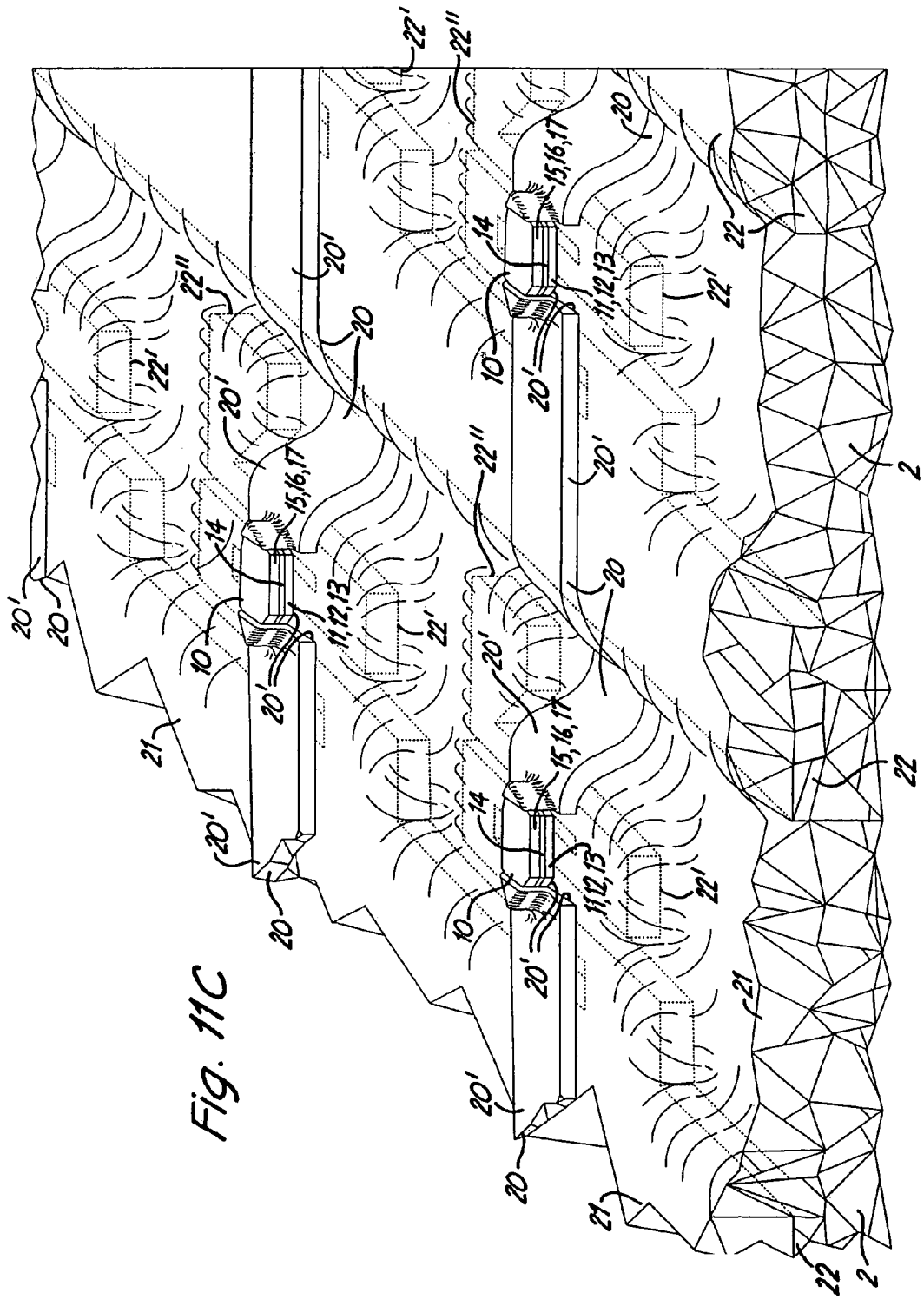

FIG. 11A shows an array of magnetoresistive memory cells, 10, similar in many respects to the cell of FIG. 1 (or that cell with the layers therein provided in inverse order out from the substrate) in and from which data is to be stored and retrieved using thermal methods as indicated above, these cells being provided on substrate 2 containing a monolithic integrated circuit for operating the cells. Cells 10 may each be a GMR effect based cell with a some sort of a "pinning" layer, 11, perhaps an antiferromagnetic material layer, adjacent to a ferromagnetic material layer, 12, perhaps supplemented by another ferromagnetic material layer, 13, to form a "pinned" layer structure, 11, 12, 13, on one side of a nonmagnetic layer, 14, which is electrically conductive in a GMR effect based cell. Provided on nonmagnetic layer 14 is a "free" layer, 15,16,17, of relatively small effective coercivity that is provided to form cell 10 as a spin valve type memory cell. Layer 15,16,17 may be a homogeneous layer of ferromagnetic material, or it may be a layer formed as a composite of other layers of various kinds of materials including plural layers of differing ferromagnetic materials and possibly combined with yet another layer but of a nonmagnetic material.

Memory cells 10 are shown in FIG. 11A interconnected by sense line interconnections, 20, in parallel series strings so that each such string forms a sense line, 20', extending from left to right in the figure (or vice verse). Interconnections 20 and cells 10 in these strings 20' are provided on an electrically insulating material layer, 21, to be separated by portions of that layer from, and positioned over, a set of word lines, 22, shown in dashed line form, that extend parallel to one another and perpendicular to the sense lines so that each of these word lines passes under a corresponding sequential set of cells 10 such that each cell in the set is in a different string.

These sense lines and word lines in FIG. 11A together allow coincident current pulses therein to generate coincident thermal pulses thereabout that combine at selected ones of cells 10 where a current activated sense line and a current activated word line cross one another. Data can be stored in such cells when heated through use of smaller magnitude currents than otherwise required as described above. Data sensing currents for retrieving stored data from cells 10 are established in those cells 10 through sense lines 20' as also described above.

Alternatively, as shown in FIG. 11B, where the same designations are used as in FIG. 11A for similar structures, sense line path heating lines, 20", are provided each parallel to a corresponding sense line on a side thereof opposite the substrate, i.e. word line like structures each paralleling the path of a corresponding one of sense lines 21' but on the opposite side of the cell from word lines 22. Heating lines 20" can be of higher resistivity material across from cells 10, or just narrower there, or both, to increase the thermal pulses energies primarily in the vicinity of those cells that result when electrical current is established in those heating lines. Thus, the current pulses for heating a selected cell can pass through the adjacent heating line 20" and the adjacent word line 22, and need not pass through such selected ones of cells 10 even though these cells, when selected, are subjected to corresponding thermal pulses resulting from those currents. Data sensing currents for retrieving stored data from cells 10 are, as before, established in those cells 10 through sense lines 20'.

In a further alternative, the establishment of heating current pulses for a selected cell 10 can be accomplished through a portion of its sense line 20' and a portion of its corresponding word line 22, as well as through that selected cell, if the cell is electrically connected by a switching transistor to that word line. In the FIG. 11A arrangement, there would be an electrical current conduction via from word line 22 at each of cells 10 therealong into substrate 2 to the corresponding switching transistor in the substrate for that cell, and a further conduction via into the substrate to the other side that transistor along the main current flow path therethrough from an adjacent interconnection 20 in contact with that cell. Thus, opening the circuit at one end of a sense line 20' in which a selected cell is connected, and placing the other end at a voltage relatively low or high with respect to the voltage concurrently established on the adjacent one of word lines 22, will allow current to be established through portions of that sense line and that word line as well as the cell if the cell switching transistor is switched on to provided a thermal pulse to that cell. Data storage currents are used to store data during such heating in a similar manner to the description above, and sense currents in sense lines 20' again are used to determine the cell resistance in retrieving stored data therefrom.

On the other hand, the establishment of heating current pulses for a cell 10 only on a word lines 22, and again not through sense lines 20' and cells 10 therein, can provide sufficient heating pulses for the cells if a corresponding switching transistor is provided for each of cells 10 electrically connected to a corresponding heating structure provided for each of the cells which in turn is connected to an adjacent corresponding word line 22. Such an arrangement is shown in FIG. 11C where again the same designations are used as in FIG. 11A for similar structures. Serpentine heating structures, 22', are provided on the substrate side of insulating material layer 21 each across from a corresponding one of cells 10 and each electrically connected at one end thereof to that word line 22 adjacent to its corresponding cell. A reduced cross section path structure is provided for heating structures 22' between word line 22 and the other end, 22", of each heating structure to increase the electrical resistance thereof but higher resistivity material could used instead of, or together with, the reduced cross sections path structures to raise the electrical resistance value.

The other end 22" of each heating structure is connected to an electrical current conduction via extending into the substrate to electrically connect to a corresponding switching transistor having the other side of that transistor on the main current path therethrough electrically connected to a voltage of a selected value such as at chip ground or at some other chosen value. Thus, a greater or smaller voltage value impressed on a word line 22 will result in an electrical current being established through any heating structure 22' connected to that word line upon having the switching transistor connected to this structure switched on to thereby provide a thermal pulse to that cell 10 corresponding to that heating structure. Again, data storage currents are used to store data during such heating in a similar manner to the description above, and sense currents in sense lines 20' again are used to determine the cell resistance in retrieving stored data therefrom. In an alternative cell construction, cells 10 can instead be spin dependent tunneling memory cells rather than GMR effect based cells if each cell is provided directly on, or at least has its bottom layer connected to, its corresponding word line 22, in which instance sense lines 20' would be continuous and electrically connected to only the top layer of those cells 10 adjacent thereto. There is relatively little change in the cell thermal characteristics since the sense line would be on the opposite side of the cell from the corresponding word line. In this instance, intermediate layer 14 would be of an electrically insulative material. In a further alternative cell construction, cells 10 can instead be spin dependent tunneling bit structure memory cells rather than GMR effect based bit structure memory cells if each cell as shown in FIG. 11B is supplemented as shown by providing a very thin electrically insulative material on layer 15,16,17 and then a ferromagnetic layer on that insulative layer perhaps in connection an antiferromagnetic layer to form a composite "pinning" layer. This "pinning" layer of each such cell is electrically connected to the corresponding one of heating lines 20". At this point in the description, cells 10 will continue to be considered to be GMR effect based cells in accord with the drawing shown in FIG. 11A.

Substrate 2 has a semiconductor base with appropriate integrated circuits formed therein on which there is provided a sequence of alternate silicon dioxide and metallization interconnection layers together, there being a further silicon dioxide layer deposited thereon of 300 Å thickness. Word lines 22 are provided on this last silicon dioxide layer in substrate 2 by patterning a 40 Å thick layer of tungsten which are then covered, along with the remaining exposed portions of the last silicon dioxide layer in substrate 2, by silicon dioxide layer 21 again 300 Å thick. Memory cells 10 are patterned on top of silicon dioxide layer 21, and interconnected with sense lines 20'. Further protective covering layers are omitted for clarity.

Figure 12A:
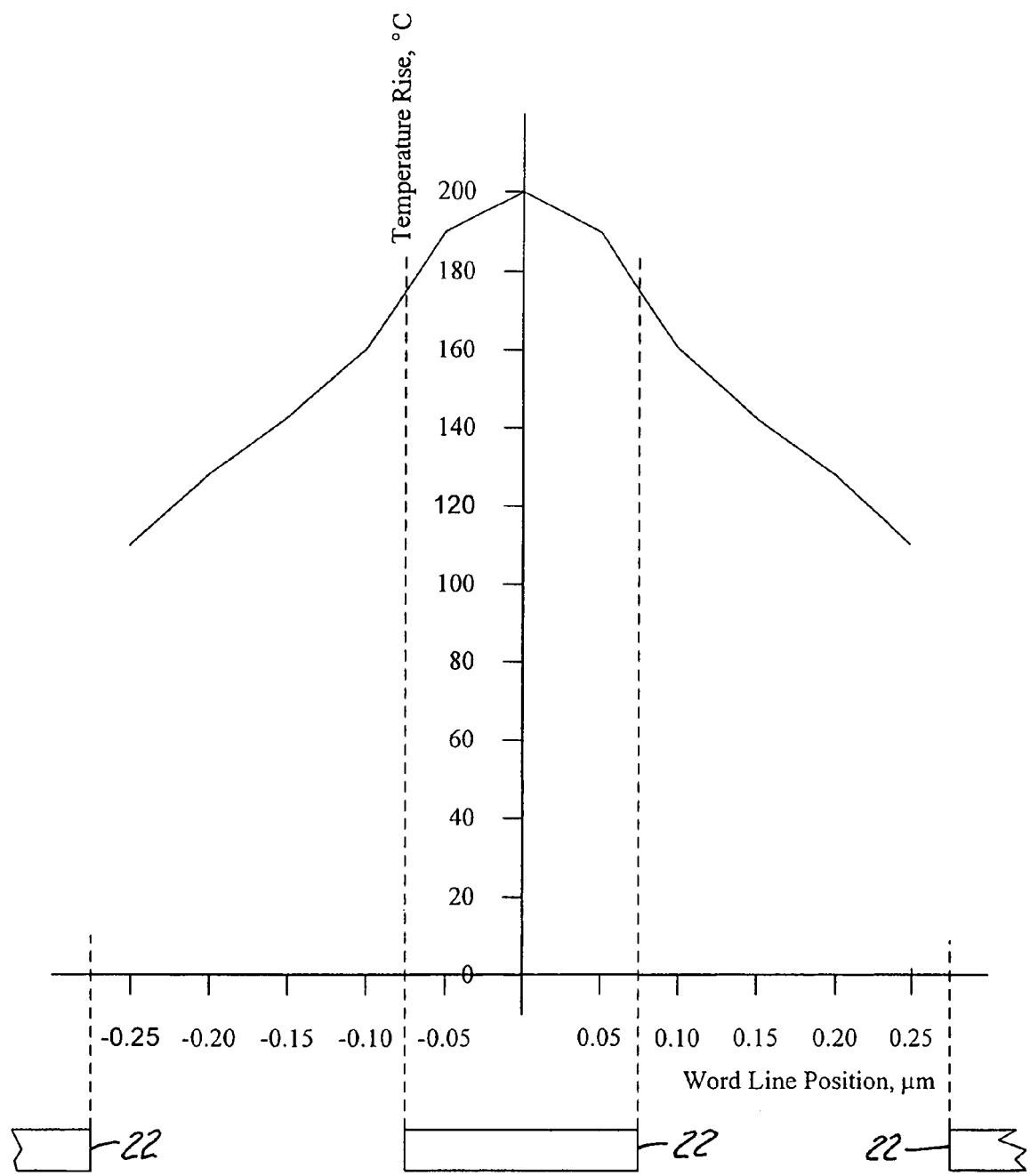
FIGS. 12A and 12B represents graphs of a response for a structure similar to that shown in FIG. 11A, FIGS. 13 through 21 views of portions of monolithic integrated circuit structures embodying the present invention.
Figure 12B:
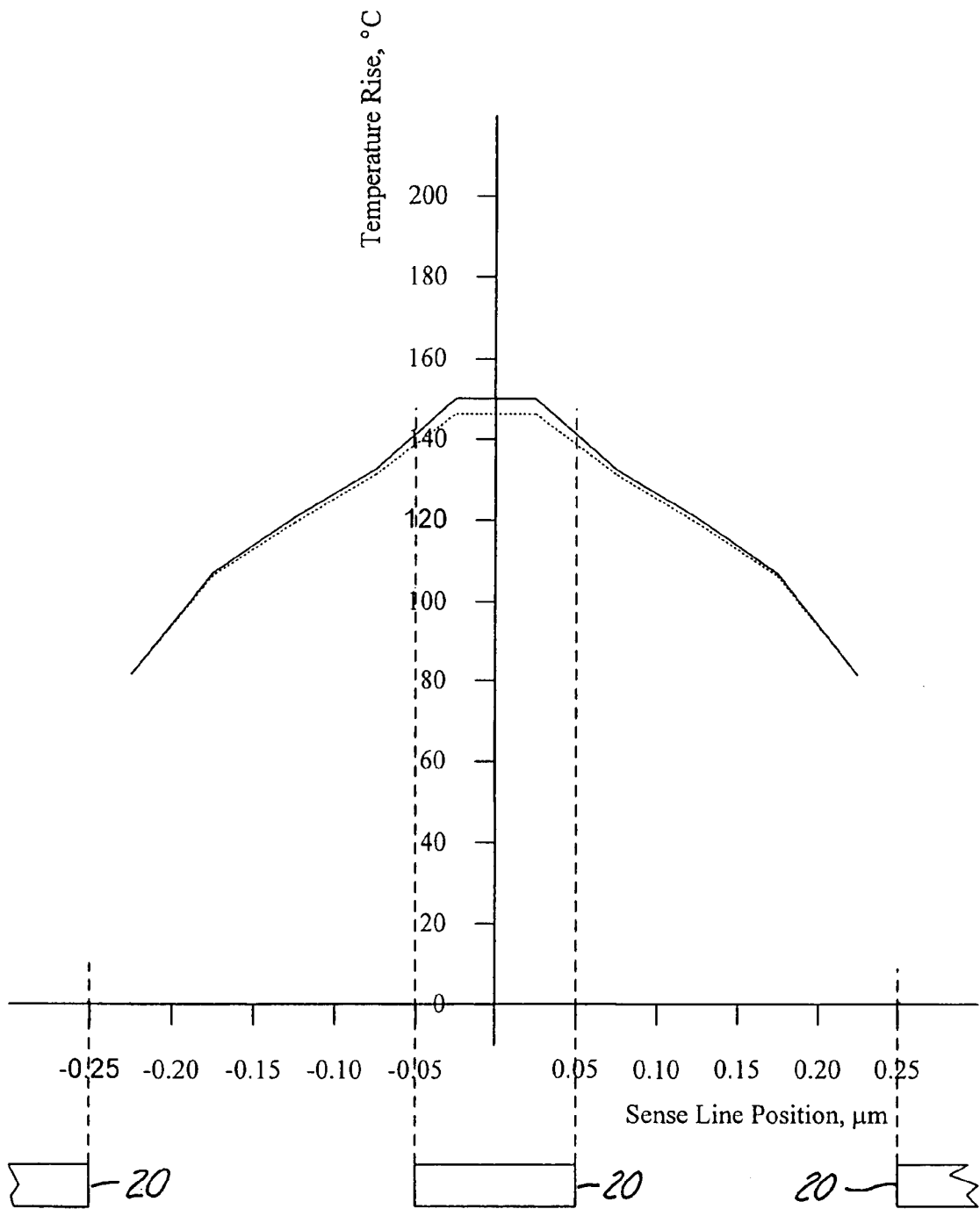

If electrical currents in the device of FIG. 11A are initiated and maintained for a sufficiently long time in a selected one of sense lines 20' and in a selected one of word lines 22, thermal equilibrium will be reached thereabout. A resulting temperature profile calculated for the region about a word line 22 having such a current therein is shown in FIG. 12A and a resulting temperature profile calculated for the region about a sense line 20' having such a current therein is shown in FIG. 12B. The solid line profile represents the result with respect to the center of the word line below which has a higher temperature than at the sides thereof, as seen in FIG. 12A, and the dashed line profile represents the result with respect to the edges of the word line below.

As can be seen, the temperature rise due to these currents in the selected one of word lines 22 and the selected one of sense lines 20' is quite substantial but is, nevertheless, closely confined about the selected lines in there being a much smaller rise at adjacent word lines and sense lines, respectively, so that the magnetizations in these adjacent cells are not disturbed. This occurs because of the sufficient extents of, and the smallness of thermal conductivities of, the interconnection structures used with the memory cells and because of the sufficient extents of, and the smallness of thermal conductivities of, of those portions of the substrate supporting the memory cells and the materials positioned therebetween.

Such thermal pulses thus can be used to raise the temperatures of the layers in a selected magnetoresistive effect based magnetic memory cell in connection with the storage of data therein that is provided in a relatively dense monolithic integrated circuit chip surface array of such cells without adversely affecting the magnetic state of adjacent memory cells. Depending on the structure chosen for such memory cells and the operating methods therefor, one, two, three or even four of the magnetic material layers therein can be involved in thermal pulse data storage operations where these are layers that have a magnetic property that is substantially maintained below a corresponding critical temperature above which such property is not maintained. These critical temperatures can involve the corresponding Curie point temperatures for ferromagnetic material layers or blocking temperatures for antiferromagnetic material layers, or both.

Curie point temperatures can be selected in a range for permalloy ferromagnetic materials by changing the composition thereof to some extent by adding other alloying material such as chromium or vanadium and, of course, different ferromagnetic materials can be substituted for one another to obtain ferromagnetic layer materials with different Curie point temperatures. Similarly, antiferromagnetic materials such as CrPtMn or FeMn can be substituted for one another to obtain antiferromagnetic layer materials with different blocking temperatures or, again, the composition of such a material can be altered to some extent to change blocking temperature values thereof.

As indicated above for very small magnetoresistive effect based memory cells, providing a sufficient energy well depth for a half selected cell to maintain thermal stability is necessary as is keeping the current density within suitable limits in the sense and word lines used with the cells. The use of thermal pulse operating methods with memory cells exploits the heat that is created by currents in these lines rather than accepting such heat generation as a limit to thereby allow the construction of smaller memory cells despite the increased demagnetization fields such smaller cells exhibit below such critical temperatures. Some additional cell structures are described below beyond those already described in the foregoing.

Figure 13A:
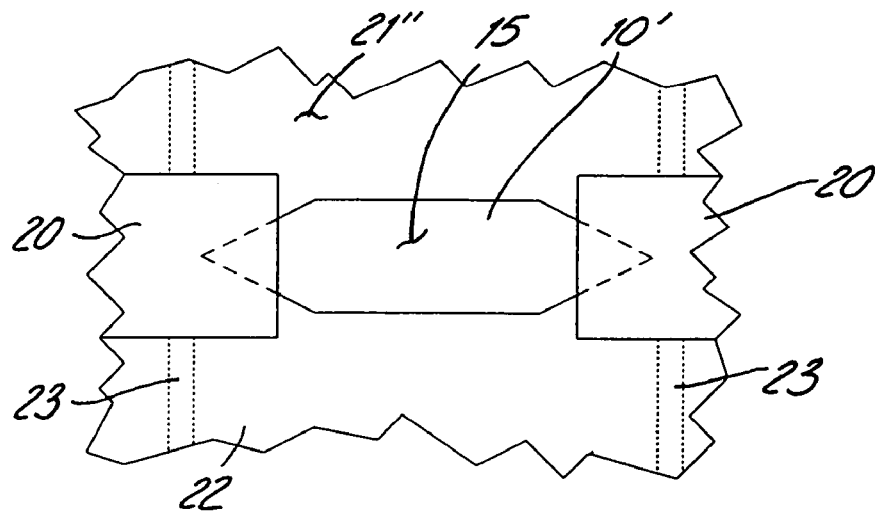
Figure 13B:
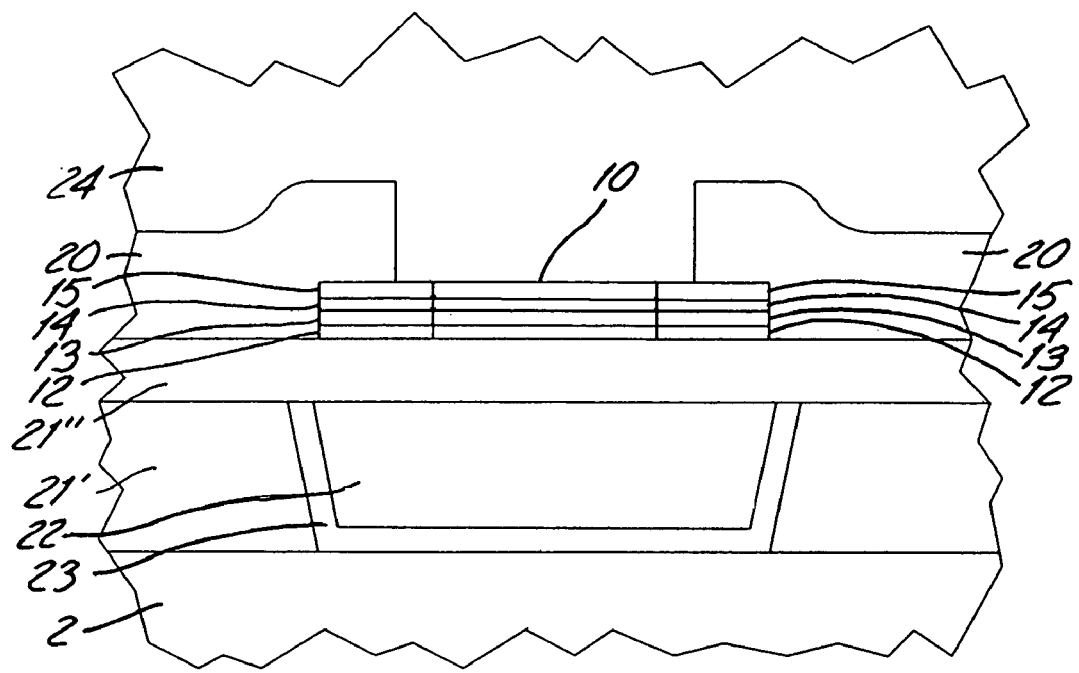

FIG. 13A is a top view, and FIG. 13B is a cross section view, of a thermal pulsed operation magnetoresistive effect based memory cell, 10'. Memory cell 10' is electrically connected to others of the memory cells in the array thereof provided on a surface in the monolithic integrated circuit in which the memory is provided and the operating circuitry therefor through sense lines 20. Word line 22 and ferromagnetic material field keeper cladding, 23, provided about the sides and lower surface of word line 22, are together supported on and separated from the operating integrated circuit portion of substrate 2 by a silicon nitride layer on the interconnection portion of the operating monolithic integrated circuit having a thickness of 500 Å. A further silicon nitride planarization layer, 21', is provided on this last silicon nitride layer in substrate 2 alongside word line 22. Word line 22 is electrically isolated from memory cell, or bit structure, 10' by a further silicon nitride layer, 21", which is 250 Å thick.

Memory cell 10' is a "pseudo" spin valve cell based on the GMR effect in having a relatively high coercivity layer due to the greater thickness of ferromagnetic material on one side of an electrically conductive intermediate layer versus a thinner layer of ferromagnetic material on the opposite side. Hence, this latter layer will have the direction of its magnetization switched in the presence of an appropriate externally applied magnetic field of a lower magnitude than that needed to switch the magnetization direction of the thicker ferromagnetic material on the opposite side.

Thus, bit structure 10' has two ferromagnetic permalloy material layers 13 and 15 each 25 Å thick with common Curie point temperatures of $Tc_2$ separated by a nonmagnetic copper layer 14 that is also 25 Å thick. However, in addition, further ferromagnetic permalloy material layer 12 of 20 Å thick ferromagnetic material is provided under layer 13 but of a ferromagnetic material having a Curie point temperature $Tc_1$ that is lower than $Tc_2$. Ferromagnetic layers 13 and 15 may have cobalt rich regions near their interfaces with copper layer 14 to provide greater magnetic saturation materials to enhance the GMR effect magnetoresistance. A protective layer of silicon dioxide, 24, is shown over cell 10' in FIG. 13B but omitted in FIG. 13A for clarity. The greater thickness data storage layer is provided by the composite ferromagnetic layer formed by strata layers 12 and 13, and layer 15 forms the "free" layer for the device. The easy axes of ferromagnetic layers 12, 13 and 15 all parallel the long dimension of bit structure 10'.

In storing data in cell 10', the currents in the word line 22, and in sense line interconnections 20 and cell 10', are increased so that the coincident heating increases the cell temperature above $T_{C1}$. The polarity of the magnetic field created by the direction of the current in word line 22 as the line currents are reduced determines the magnetization of the composite storage layer at temperatures below the critical temperatures of the magnetic material layers therein. When heated to temperatures above the Curie point temperature $Tc_1$ of layer 12 to cause it to lose its magnetization, the two ferromagnetic layers 13 and 15 are matched layers and the effective shape anisotropy would be about 165 Oe+Hk. This is much smaller than the effective shape anisotropy at temperatures below the Curie point temperature $Tc_1$ of layer 12, where layer 12 retains its magnetization properties, and the magnetizations of layers 12 and 13 effectively combine to provide an additional magnetic moment equivalent to 20 Å of thickness with layer 12 thereby adding a shape anisotropy of 500 Oe. This anisotropy addition would require much larger fields, and so much larger currents to generate such larger fields, to switch the magnetization direction of layer 12,13 and layer 15 to store data therein as compared to switching the magnetization direction of just layers 13 and 15 at temperatures above $Tc_1$ for that purpose.

However, as stated above, at the data retrieval operating temperature below the Curie point temperature $Tc_1$ of layer 12, layer 12 retains its magnetization properties, and the magnetizations of layers 12 and 13 effectively combine to provide an additional magnetic moment equivalent to 20 Å of thickness with layer 12 thereby adding a shape anisotropy of 500 Oe. The total anisotropy of layers 12 and 13 becomes 500 Oe+165 Oe+Hk to strongly maintain the magnetization direction of layer 12,13 and so the data stored therein, against the external magnetic fields used to switch the magnetization of film 15, then effectively magnetically much thinner than layer 12,13, back and forth for data retrieval at temperatures below $Tc_1$. Such external fields for retrieving data need only overcome the residual demagnetizing fields and anisotropy which takes only 75 or 80 Oe. Further, for expected cell structure temperatures of 400 to 450K resulting from supplying electrical current in just one of word line 22 and interconnections 20, i.e. a "half-select", the energy well depth remains greater than 55 kT.

In using free layer 15 to retrieve data stored in storage layer 12,13, during data retrieval operations, "free" layer 15 is put into one of its two desired states by coincidentally providing sense and word line currents to force the cell temperature to exceed $T_{C1}$ and then ending the word line current and reducing the sense line current to cool the cell but maintaining a relatively low sense current in the appropriate direction to set the desired magnetic state. Once the free layer magnetization direction is set, the resistance of the cell is measured using a current through cell 10' between interconnections 20 on either side thereof. Layer 15 is then placed in the opposite of its two stable states by raising the temperature of the cell again beyond $T_{C1}$ and then cooling as before but providing a low sense current in the opposite direction in doing so. The resistance is measured again and the algebraic sign of the difference between the two measured resistance values is found to determine the magnetization state of the cell.

Figure 14A:
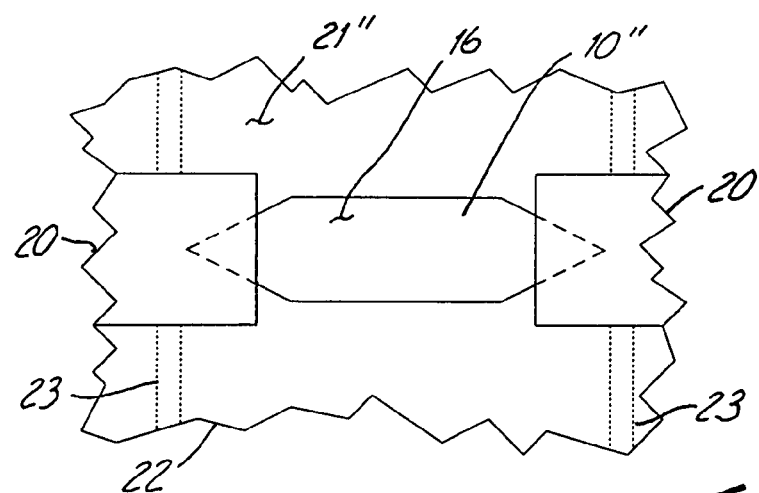
Figure 14B:
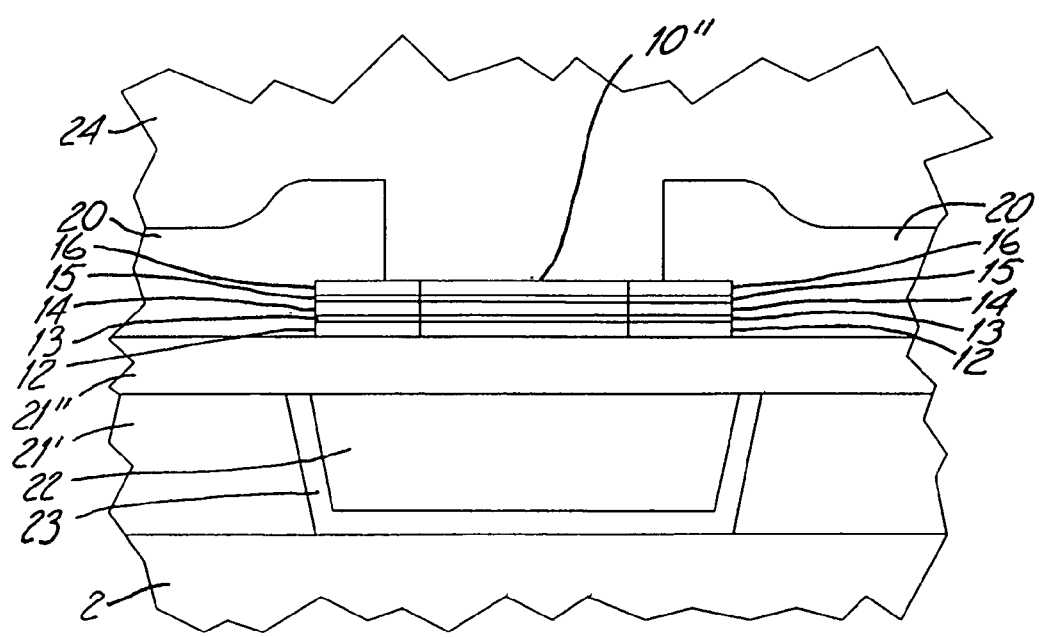

FIG. 14A is a top view and FIG. 14B is a cross section view of another bit structure, 10", having similar structural components to those shown in FIG. 13 in sense line interconnections 20, keepered word line 22, substrate 2, and dielectric material structures 21', 21" and 24. As "pseudo" spin valve cells are scaled to smaller dimensions, the demagnetizing effects of the magnetic flux bridging from the ferromagnetic layer or layers on one side of the intermediate layer to the ferromagnetic layer or layers on the other side thereof through that intermediate layer significantly increases the magnitudes of the externally applied magnetic fields required to cause reorientation of the layers magnetization directions. However, if two low Curie point temperature materials are used for the device ferromagnetic material layers, but each with a Curie point temperature different from that of the other, this effect can be diminished.

Thus, ferromagnetic permalloy material layer 12 is 25 to 40 Å thick as is ferromagnetic material layer 16 but with layer 16 having a lower Curie point temperature $Tc_1$ than the Curie point temperature $Tc_2$ of layer 12. Cobalt layers 13 and 15, located on either side of copper 6 intermediate layer 14 to provide greater magnetic saturation materials next to layer 14, are each 10 Å thick and both have Curie point temperatures that are greater than either $Tc_1$ or $Tc_2$. Ferromagnetic material layers 12, 13, 15 and 16 each has its easy axis parallel to the long dimension of bit structure 10". The data storage layer is formed from the composite of layers 12 and 13, i.e. layer 12,13, and the device "free" layer is provided by layer 15 as the data retrieval process causes the cell structure temperature to exceed the Curie point temperature $Tc_1$ at which point layer 16 loses its magnetic characteristics exhibited at lower temperatures. However, in storing data, currents and temperatures are increased so both and $Tc_2$ are exceeded, but without exceeding the Curie point temperatures of layers 13 and 15. Then the cell magnetization direction need be set in only the presence of two effectively magnetic material thin layers, layers 13 and 15, as layers 12 and 16 both lose their magnetic characteristics exhibited below $Tc_2$ and $Tc_1$, respectively, so as to require much less magnetic field generating current than would be required for switching the magnetization direction of effectively magnetic material thick layers 12,13 and 15,16 as would be needed at such lower temperatures.

During a two sample data retrieval process as the magnetization direction of thin layer 15 only is being switched as described above, the forcing of the cell structure temperature to exceed $T_{C1}$ reduces the effective magnetic material thickness of the "free" layer to only about the 10 Å of layer 15 as layer 16 has lost its magnetic characteristics. An effective magnetic material "free" layer thickness of 10 Å during data retrieval switching reduces the needed external magnetic fields by about 60% from the 25 Å thick "free" layer situation described above, or allows reducing the cell width to 0.032 microns from 0.05 microns using the same fields.

Figure 15A:
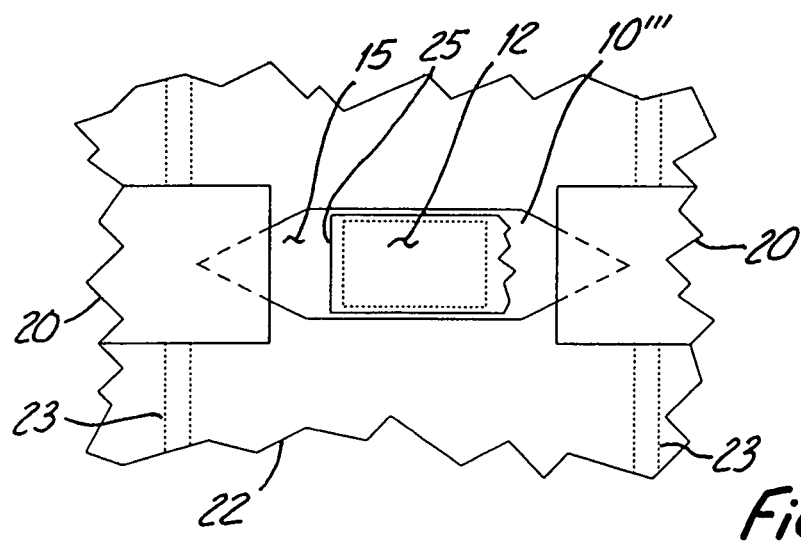
Figure 15B:
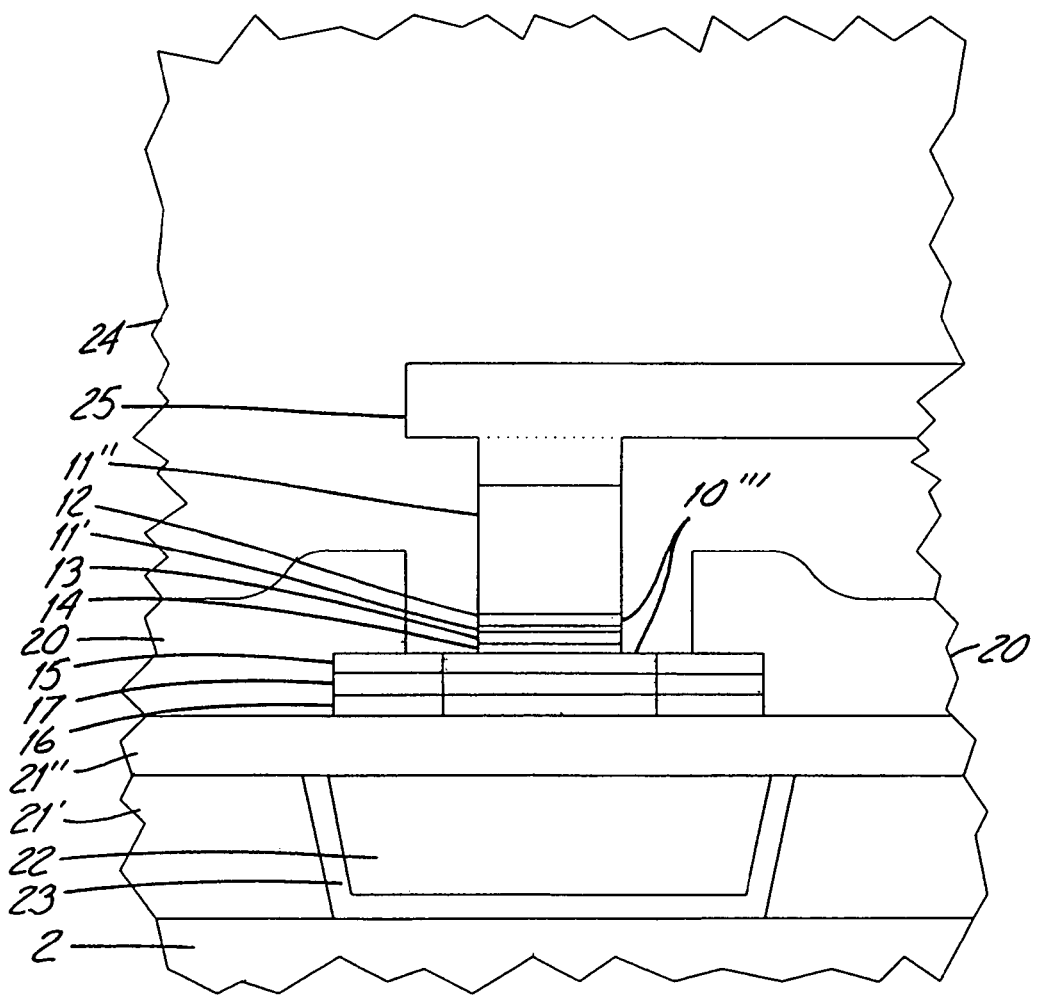

FIG. 15A shows a top view of a spin dependent tunneling bit structure, 10''', with some broken away portions, and FIG. 15B shows a cross section view of that structure. Again, this bit structure has similar structural components to those shown in FIG. 13 in sense line interconnections 20, keepered word line 22, substrate 2, and dielectric material structures 21', 21" and 24. This cell construction in FIG. 15 would be suitable as the spin dependent tunneling bit structure alternative cell construction described above in connection with FIG. 11B.

Bit structure 10''' in FIGS. 15A and 15B is inverted from the foregoing bit structures in FIGS. 13 and 14 in having a GMR effect based "sandwich" structure serving in the device as the "free" layer, this "sandwich" structure formed by ferromagnetic material layers 15 and 16 each with a 40 Å thickness and a Curie point temperature $Tc_1$ of 150° C. separated from one another by a 40 Å thick copper layer 17 all supported directly on insulating layer 21". An 15 Å thick aluminum oxide barrier layer serves as intermediate layer 14 supported directly on ferromagnetic layer 15, and in turn supports a synthetic antiferromagnet as a reference layer formed by 60 Å thick ferromagnetic material (cobalt) layers 12 and 13 with Curie point temperatures $Tc_2$ of 300° C. separated by an 8 Å ruthenium layer 11' as an antiferromagnetic coupler. Layer 12 directly supports a 300 Å antiferromagnetic material layer 11" of CrPtMn having a blocking temperature $Tb_1$ of 225° C. to which an aluminum electrode interconnection, 25, is made. The easy axes of ferromagnetic material layers 15 and 16, and the reference direction of the synthetic antiferromagnet, are all perpendicular to the long dimension of bit structure 10''' to reduce the effective anisotropy thereof, and the cell resistance is typically determined by a current provided vertically in FIG. 15B through barrier layer 14.

During data retrieval operations, the "free" layer "sandwich" structure is put into one of its two desired states by coincidentally providing sense and word line currents to force the cell temperature to exceed $T_{C1}$ and then ending the word line current and reducing the sense line current to cool the cell but maintaining a relatively low sense current in the appropriate direction to set the desired magnetic state. Once the free layer magnetization direction is set, the resistance of the cell is measured using a current through the barrier layer. The free sandwich is then placed in the opposite of its two stable states by raising the temperature of the cell again beyond $T_{C1}$ and then cooling as before but providing a low sense current in the opposite direction in doing so. The resistance is measured again and the algebraic sign of the difference between the two measured resistance values is found to determine the magnetization state of the cell.

In storing data, coincidentally provided sense and word line currents heat the cell to temperatures above $T_{C2}$ and $T_{b1}$. The sense and word line currents are then reduced and, as the cell is subsequently cooling, the composite storage layers of the synthetic antiferromagnet regain magnetic material behavior with a magnetization direction determined by the low sense current based magnetic field provided during cooling which is becomes pinned in storage layer 13 when the cell temperature drops below $T_{C2}$.

To illustrate the structural requirements, consider a 0.05× 0.2 $\mu m^2$ memory cells of the construction illustrated in FIG. 15A. The synthetic antiferromagnet pinning field on storage layer 13 is of the order of 400 Oe. If the cell temperature is raised above the Curie point temperature of the free layer "sandwich" ferromagnetic material layers 15 and 16 (150° C.) to 177° C., the required energy well depth is $3.42 \times 10^{-12}$ ergs to avoid thermal upsets of the stored magnetic state. A pinned layer 13 at least 40 Å thick is necessary to meet the well depth requirements. Sandwich magnetic layers 30 Å thick just meet the stability requirement during data retrieval operations when the cell has cooled to about 85° C. from 150° C.

In an arrangement having eight of these tunnel cells connected in parallel with each other along an output line, an adequate output signal can be obtained indicating a selected memory magnetic state for a memory with a 30 to 50 nanosecond data retrieval cycle time. Tunneling barrier materials have been demonstrated with 30% magnetoresistance change ratio with 0.2 volts across the barrier, and with a barrier resistance of 1500 $\Omega$-$\mu$m². This yields a 7.5 mV signal on a 25000 $\Omega$ output line for the cells indicated. The signal voltage would exceed the Johnson noise voltage present by more than twenty. In such an arrangement, an amplifying transistor is shared eight ways and so the array density is not limited by transistor substrate surface area.

Figure 16A:
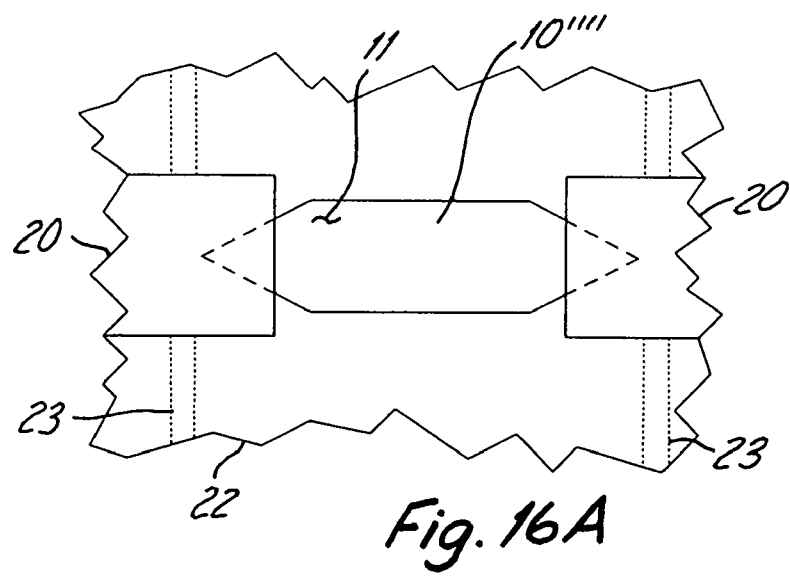
Figure 16B:
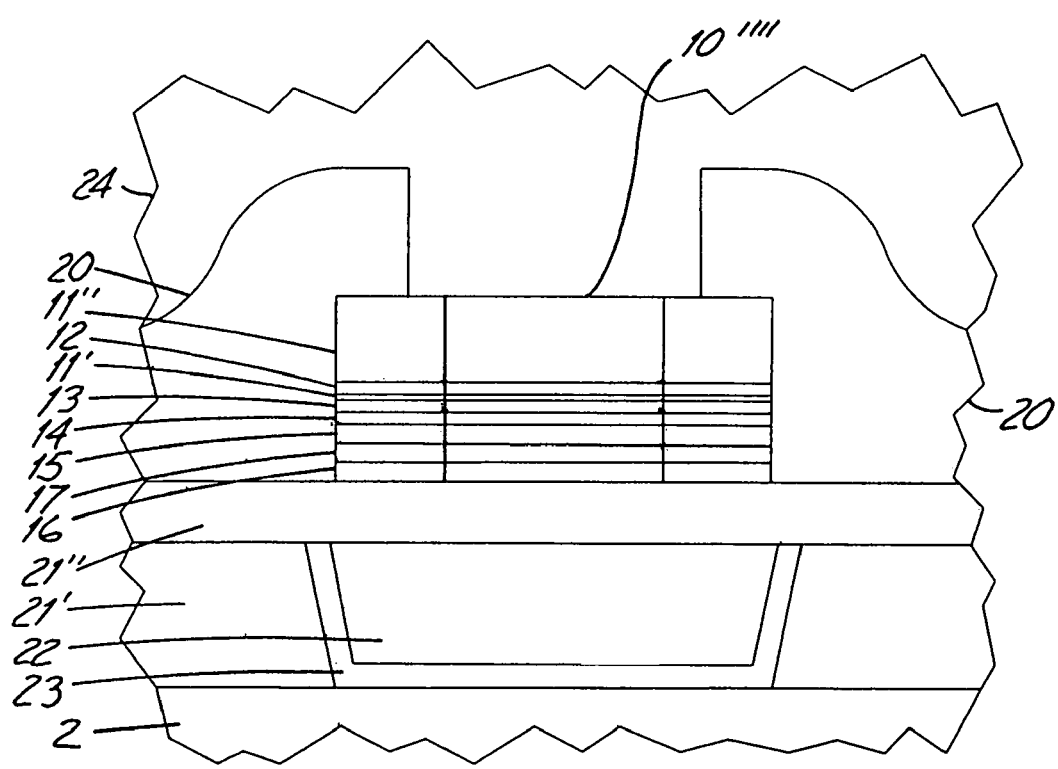

FIG. 16A is a top view, and FIG. 16B a cross section view of a memory cell, 10'''', similar to that shown in FIG. 15, but using the GMR effect rather than the spin dependent tunneling effect through substituting an electrically conductive layer for the barrier layer forming intermediate layer 14 in FIG. 15. Otherwise, the same layer materials are again used with the same easy axis direction and reference direction, and the cell is operated to again make use of three different layer critical temperatures following similar data storage and data retrieval operations as are used in conjunction with the device of FIG. 15. Cell resistance, however, is measured between sense line terminals 20.

The "free" layer "sandwich" structure in the cell of FIG. 16 is again formed of ferromagnetic material layers 15 and 16 separated by copper layer 17. Layer 14, formed of 25 Å of Cu separates the "free" layer "sandwich" structure and the synthetic antiferromagnetic reference structure. The synthetic antiferromagnetic structure again has ruthenium coupling layer 11' between ferromagnetic material layers 12 and 13 which together support antiferromagnetic material layer 11".

Figure 17A:
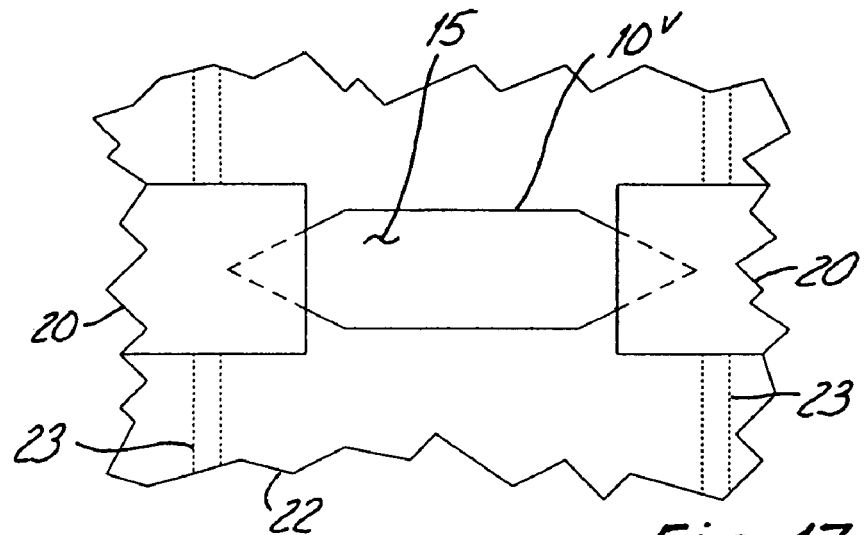
Figure 17B:
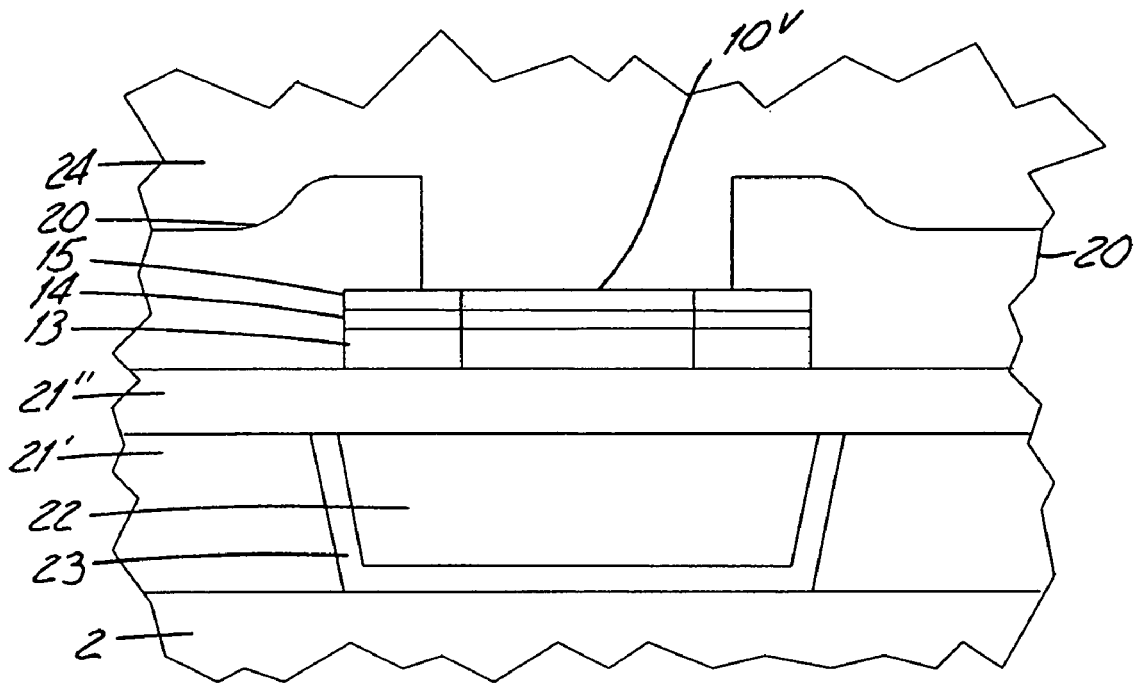

FIGS. 17A and 17B show top and cross section views of a "pseudo" spin valve memory cell, 10ᵛ, having two ferromagnetic material layers 13 and 15 separated by a nonmagnetic electrically conducting intermediate layer 14 having a thickness of about 25 Å. Here, too, this bit structure has similar structural components to those shown in FIG. 13 in sense line interconnections 20, keepered word line 22, substrate 2, and dielectric material structures 21', 21" and 24. Thicker ferromagnetic reference layer 13 has the greater Curie point temperature so as to be capable of maintaining its magnetic state representing the stored data when thinner "free" layer 15, having a lesser Curie point temperature, is set in one magnetic state and then the other by forcing the cell structure temperature to exceed this latter Curie point temperature along with measuring the cell resistance in each state to thereby retrieve data from the cell.

One or both of ferromagnetic layers 13 and 15 can be made with relatively low Curie point temperatures ferromagnetic materials with each having its easy axis parallel to the long dimension of bit structure 10ᵛ. Maximum density can be achieved if both layers have such low Curie point temperatures since the smaller heating of the cell with coincident word and sense line currents necessary to get the cell temperature up to these relatively lower temperatures assures less heat flow to adjacent memory cells (thinner layer 15 still, of course, having the lowest Curie point temperature of the two ferromagnetic layers). Storing data in the cell requires again that the cell temperature be forced above the Curie point temperatures of both ferromagnetic material layers. If the length and width of cell 10ᵛ are selected to be 200 nm and 50 nm, respectively, a layer thickness of 50 Å for layer 13 and 30 Å for layer 15 is adequate to meet the thermal stability requirements.

Figure 18A:
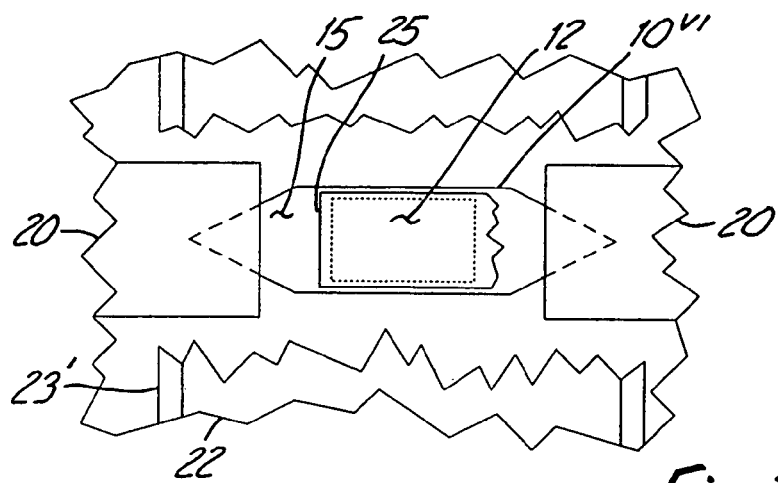

In a departure from the foregoing, FIGS. 18 and 19 show spin dependent tunneling memory cells with the keepered word line 22 positioned above the magnetoresistive memory cells. In most situations in the foregoing, the word line shown being below the memory cell could just as well be positioned above that cell as is demonstrated here with respect to the otherwise very similar device structure shown in FIG. 15. Thus, the structures in FIGS. 18 and 19 are otherwise similar to those of FIG. 15 but with some different layer sizing.

Figure 18B:
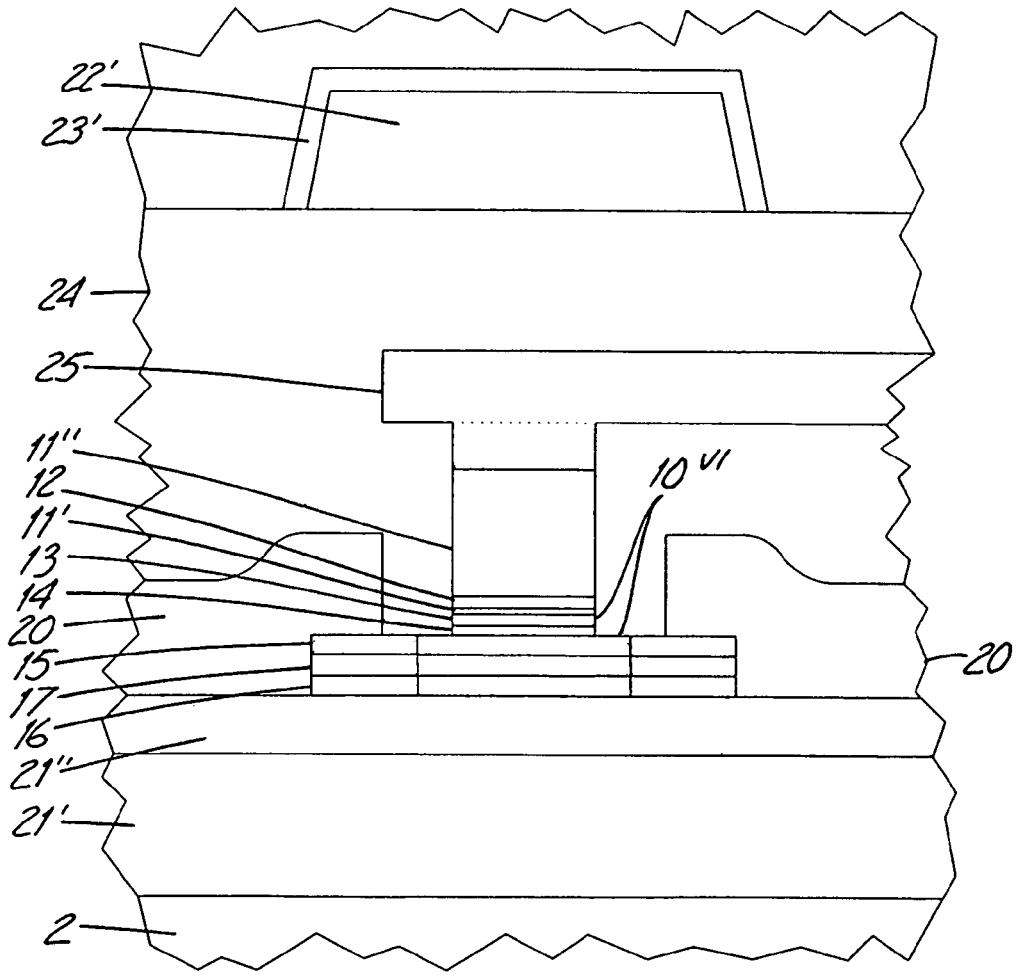

FIG. 18 A again shows a top view of a spin dependent tunneling bit structure, 10ᵛⁱ, with some broken away portions, and FIG. 18B shows across section view of that structure arranged to be operated using typical coincident word and sense line electrical currents in a conventional cell operated without use of thermal pulses to cause cell structure temperatures exceeding the critical temperature of at least some magnetic material layer. These currents in turn generate coincident external magnetic field pulses to switch magnetization directions of ferromagnetic layers in the "free" layer "sandwich" structure in the cell in which the data must be stored since switching the magnetization of the reference structure in the cell in the absence of use of thermal pulses would require prohibitive currents in such a conventional cell.

Layers 15 and 16 in spin dependent tunneling bit structure 10ᵛⁱ are 35 Å thick permalloy layers each having its easy axis parallel to the long dimension of bit structure 10ᵛⁱ, and layer 17 is a nonmagnetic tungsten layer 30 Å thick. Barrier layer 14 and the layers in the synthetic antiferromagnet, used here as a magnetization direction reference structure, are as they were in FIG. 15, as are substrate 2, word line 22' with cladding 23' except for position as indicated above, sense lines 20 and dielectric material structures 21', 21" and 24 except for the accommodation needed for the position change of word line 22'. The magnetization direction reference is also parallel to the long dimension of bit structure 10ᵛⁱ

The "free" layer "sandwich" structure is chosen to be 0.6 $\mu$m long and 0.1 $\mu$m wide to result in the information being stored in the magnetization direction of the magnetic layers in the "free" layer "sandwich" structure having a well depth of 203 kT at 350 K. Assuming a material anisotropy constant of 15 Oe, the effective anisotropy is 83 Oe along the element. Because the cell resistance must be determined in the two different magnetic states of the "free" layer "sandwich" structure, the cells have a stored data retrieval process that is destructive of the stored data and so the stored data of a cell must be subsequently restored therein after a retrieval from that cell.

Figure 19A:
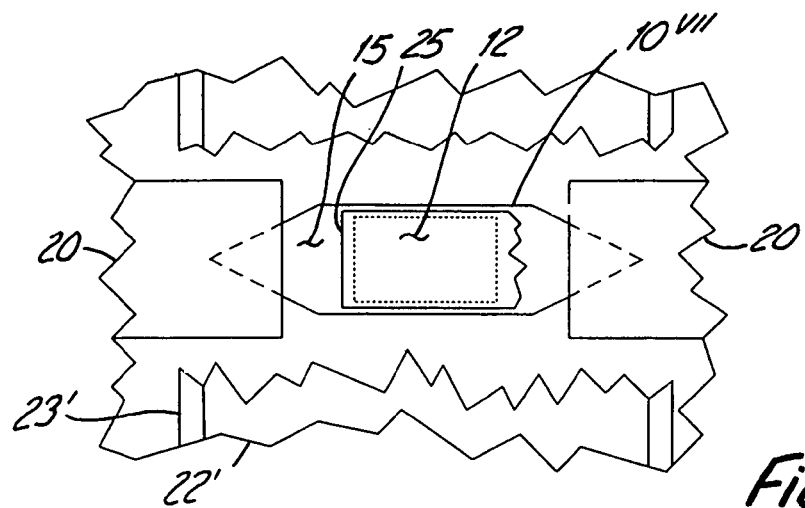
Figure 19B:
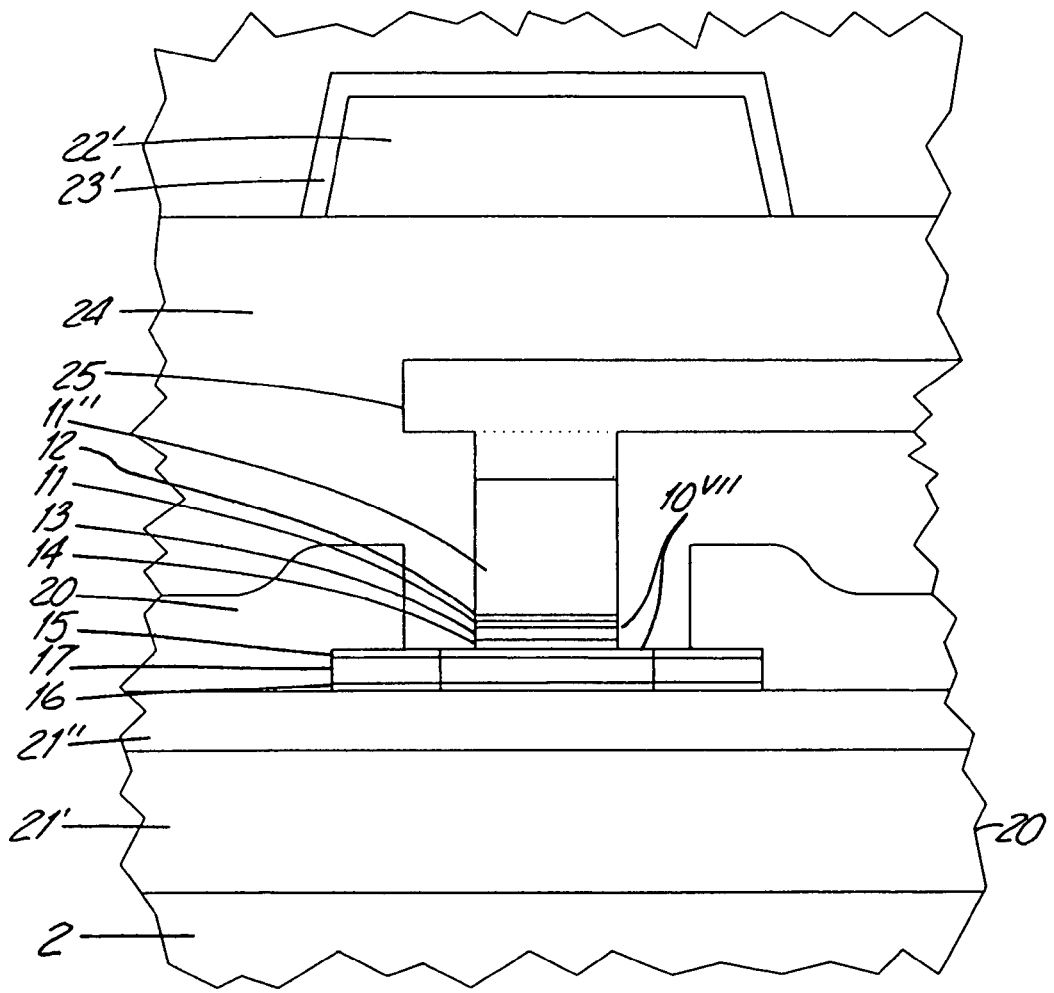

FIG. 19A shows here also a top view of a spin dependent tunneling bit structure, 10ᵛⁱⁱ, with some broken away portions, and FIG. 19B shows a cross section view of that structure. Spin dependent tunneling bit structure 10ᵛⁱⁱ is arranged to be operated with thermal pulsing through using conventional coincident word and sense line currents to in turn generate coincident thermal pulses along with a residual magnetic field to switch magnetization directions of ferromagnetic layers in the cell to allow a four times increase in the limit of the cell density over the FIG. 18 arrangement. The cell also has the added advantage of allowing the retrieval of stored data without the destruction of same because the data can in this arrangement be stored in the cell structure used as a magnetization direction reference structure in the device of FIG. 18 rather than the "free" layer "sandwich" structure.

Layers 15 and 16 of the "free" layer "sandwich" structure in spin dependent tunneling bit structure 10'''' are 12 Å thick permalloy layers with the same Curie point temperatures as in the cell of FIG. 15 and with the same easy axis direction in being perpendicular to the long dimension of bit structure 10'''' to thereby reduce the effective anisotropy thereof to 43 Oe. Layer 17 between them is a nonmagnetic tungsten layer 20 Å thick. Barrier layer 14 is as it was in FIG. 15, as are substrate 2, word line 22' with cladding 23' except for position as indicated above, sense lines 20 and dielectric material structures 21', 21" and 24 except for the accommodation needed in connection with the position change of word line 22'. The synthetic antiferromagnet structure has layer 13 with a thickness of 20 Å and layer 12 with a thickness of 10 Å and the same Curie point temperatures as in FIG. 15 but instead again having its magnetization direction outside of switching always parallel to the long dimension of bit structure 10'''', and has layer 11' again with a thickness of 8 Å. Layer 11" is as it was in FIG. 15. The "free" layer "sandwich" structure is chosen here to be just 0.21 μm long and 0.05 μm wide.

The data storage operation in spin dependent tunneling bit structure 10'''' involves coincident heating from currents in the sense and word line to heat the cell to 350° C. (175° C. word +175° C. sense) above the 300° C. Curie temperature of the synthetic antiferromagnet (ferromagnetic layers 12 and 13 therein and the 225° C. blocking temperature of antiferromagnet layer 11"). The addition of a thin layer with a high magnetic moment adjacent to barrier layer 14 to increase the spin polarization and a further compensating similar sublayer in layer 13 of the synthetic antiferromagnet will further improve performance. After the sense current is switched off, the net magnetization of the synthetic antiferromagnet is set in the desired direction along the length of the bit structure by a then reduced word line current, and that magnetization is then "pinned" in that orientation by the antiferromagnet to store the bit value information. A coupling field of 400 Oe is assumed. The cell well depth is greater than 52 kT at 450 K.

In retrieving stored data from spin dependent tunneling bit structure 10'''', 4/10 of the storage operation word current and 4/10 of the storage operation sense current are applied to set the direction of the magnetization in the "free" layer "sandwich" structure (these reduced current magnitudes assures only 1/6 of the heating occurring during storage occurs during retrievals). The word line current is then switched off and a resistance measurement across the length of the "free" layer "sandwich" structure is taken using the sense line current. Then the "free" layer "sandwich" structure magnetization direction is reversed using the retrieval values of the word line and sense line currents, and a second resistance measurement using the sense line current after terminating the word line current is taken to complete the data retrieval operation.

As can be seen from the foregoing, heating a memory cell above the critical magnetic ordering temperatures of the magnetic material layers therein (the Néel or blocking temperature for antiferromagnetic materials and the Curie temperature for ferromagnetic materials) can change the energy well depth for the storage layers in the cell from being relatively very large near room temperatures to being very small at substantially elevated temperatures. Thus, the storage layer can be relatively thick for thermal stability at lower temperatures but nevertheless have its magnetization state set when it is heated to temperatures just below its Curie point temperature with relatively small currents in the sense and word lines.

Rather than coincident sense line and word line heating currents being used to select a memory cell, a sense current alone through the cell can be used for heating if controlled by a switching transistor, as indicated above, and if the cell has a sufficiently great internal electrical resistance for the magnitude of the current directed therethrough. Of course, the smaller the current that can be used for heating because of achieving a higher cell resistance means the smaller the size can be of the transistor used in controlling that current. Thus, such a switching transistor in series connection with the cell would control both the heating current in connection with the storing of data in the cell and the data retrieval current provided through the cell in making resistance measurements to extract the stored information from the cell. A reduced sense current, allowing the cooling of the cell after its heating by a preceding greater sense current, could also be used to set the magnetization state in the storage layer during such cooling as part of the data storage operation, or a word line could be provided adjacent to the cell to carry a small magnetization state setting current during such cooling.

Such an arrangement can be provided in a simple magnetic tunnel junction cell having an electrical insulating barrier layer provided between a "pinned" ferromagnetic layer and a "free" ferromagnetic layer. The "free" layer must exhibit a low Curie point temperature and exhibit shape anisotropy, or alternatively be a normal ferromagnetic material that is "pinned" with a low Néel temperature antiferromagnetic layer. The resistance of the sense current path through such a cell would be $R_A/A$, where $R_A$ is the resistance-area product for the tunnel junction formed by the barrier layer and A is the area of the tunnel junction. The current through, and that can be controlled by, a minimum size transistor is about 100 μA, and if the tunnel junction area is 0.1 μm on a side and the heat flux required is on the order of 0.05 mW (for a realistic thermal impedance and a temperature swing of 200° C.), then the required RA can be determined, for this current of I=$10^{-4}$ A and area of A=$10^{-2}$ μm$^2$, from $I^2R=I^2R_A/A=5*10^{-5}$=P to be 50 Ω-μm$^2$, and the resistance of the cell $R_A/A$ would be about 5000 Ω. However, the voltage across the junction would from IV=$5*10^{-5}$ have to be 500 mV at a temperature of 200° C. which risks junction breakdown.

If instead the cell comprises stacked magnetic tunnel junctions, the situation would be much better. Consider N such junctions stacked vertically with all parameters the same as above except for the stacking. Then the total heat required would be the same and the heat required per junction would be 1/N times the heat for the previous case. Assuming there is a limit $V_{tjmax}$ for reliability, then for a required heat power P, $$P=NI^2R_A/A$$

and also $$P/N=V_{tjmax}I.$$

This means for a given current and power required, stacking can reduce the required $V_{tjmax}$ by a factor 1/N, but at the same time the Ra would also have to go down by 1/N. On the other hand, if the current goes down by $1/N^{1/2}$, the Ra could stay the same and the $V_{tjmax}$ would go down be the $1/N^{1/2}$ factor. If Ra would go up by N, then I would go down by 1/N and $V_{tjmax}$ would stay the same. Thus, stacking of magnetic tunnel junctions improves the electrical characteristics of a tunnel junction cell.

Figure 20:
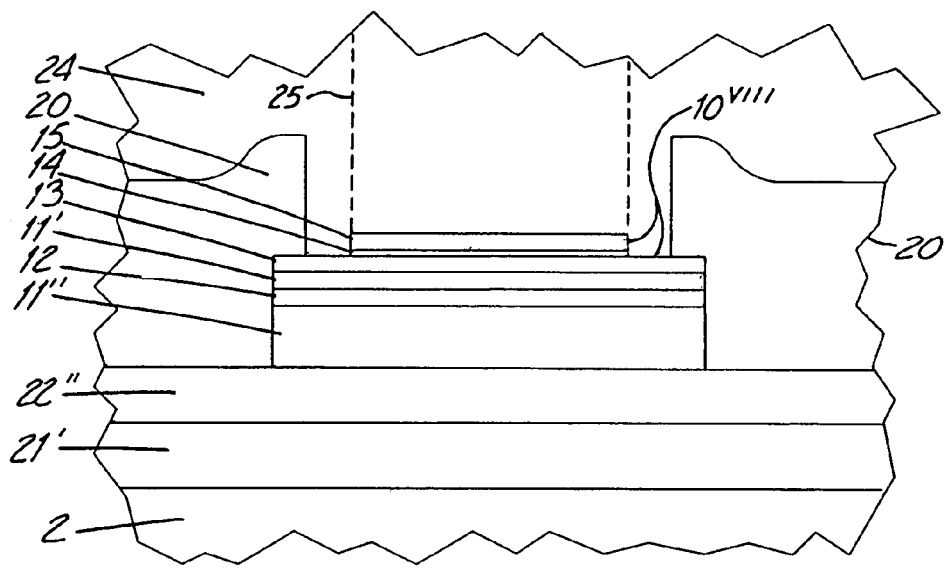

As an alternative, a tunnel junction coupled with a synthetic antiferromagnet reference layer memory cell that can be operated to raise its temperature by dissipating much of the power in the resulting series resistor structures on either side of the tunnel junction to thereby reduce the constraints on the tunnel junction but with the output signals having reduced magnitudes. Such a cell is illustrated in FIG. 20 which shows a cross section view of a spin dependent tunneling bit structure, 10'''''. Again, this bit structure has similar structural components in sense line interconnections 20, substrate 2, and dielectric material structures 21', 21'' and 24. Bit structure 10'''''' has a synthetic antiferromagnet as a reference layer supported on insulating layer 21'' formed by a high resistivity antiferromagnetic material layer 11'' and CoFeHfO ferromagnetic material layers 12 and 13 each 20 Å thick separated by a thin 8 Å ruthenium layer 11' as an antiferromagnetic coupler. Layer 13 directly supports a thin aluminum oxide barrier layer serving as intermediate layer 14 upon which "free" ferromagnetic layer 15 is provided having a low Curie point temperature. The ruthenim coupled synthetic antiferromagnet has very high resistivity and has its magnetization "pinned" in a selected direction along the length of the cell. Current through sense line interconnections 20 is split between the synthetic antiferromagnet and the free layer on the other side of barrier layer 14 with tunneling current through the barrier layer modulating the resistance of the composite device to indicate the cell magnetization, or data storage, state.

The electrical resistance of the composite resistance-tunnel junction device between the two terminals 20 has been determined for a device that is L μm long and W μm wide, and has the sheet resistivity of the heating layer 12, 11', 13 of $\rho_s$ given in $\Omega/\square$ and the tunneling resistance-area product $R_A$ given in $\Omega\text{-}\mu m^2$. Uniform current injection and removal through the heating layer is assumed in this determination to be only at the ends of that layer. The expression derived for the composite resistance $R_c$ is $$R_c = 2(R_A \rho_s)^{1/2}/W) \tan h\{L/[2(R_A/\rho_s)^{1/2}]\}.$$

In the limit where the argument of the hyperbolic tangent function tan h( ) is very small, the function is approximately equal to its argument so that $$R_c = (L\rho_s)/W,$$

which is the usual expression for the resistor without any tunneling current. In the limit where the argument is very large the function has a value approaching one, and the resistance becomes $$R_c = 2(R_A \rho_s)^{1/2}/W,$$

which can be interpreted as the sum of the two "contact" resistances on each end of the device when very little of the current flows through the synthetic antiferromagnet heating element except at the very ends of the device.

Since the hyperbolic tangent of any positive real number is less than one and increases monotonically, by inspection the maximum magnetoresistance expressed in percent terms achievable with such a magnetoresistive device is $(TMR)^{1/2} - 1$ where TMR is the tunneling magnetoresistance fractional change. For example if the TMR is 1.2, then the maximum magnetoresistance ratio of the composite film is 9.5%.

Figure 21:
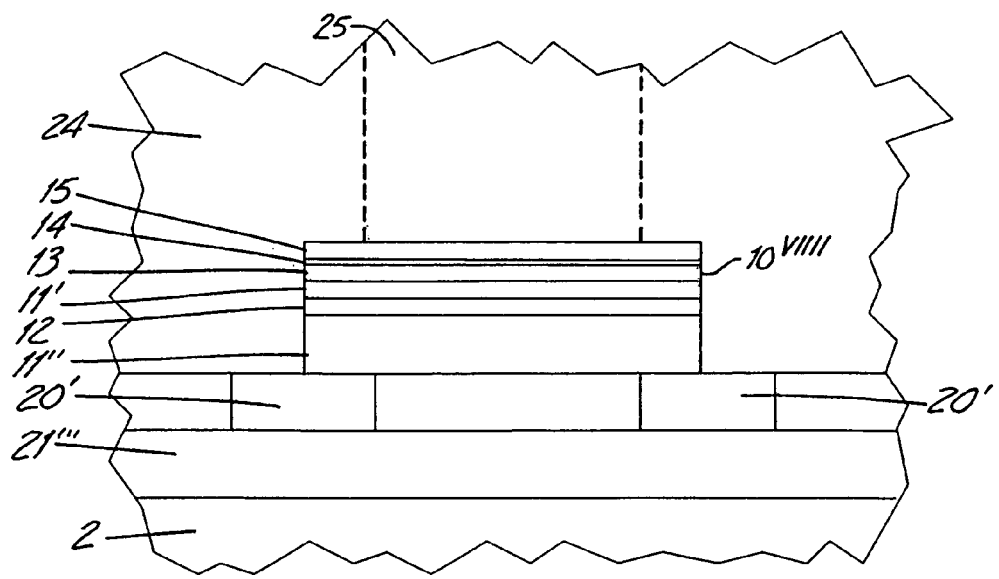

An improvement in magnetoresistance is achieved by relatively increasing the tunneling resistance through the use of shunting electrical contacts on both ends of just the synthetic antiferromagnet possibly made thinner to raise the lateral resistance thereof as shown the cross-section view provided of such a cell bit structure, 10'''''', shown in FIG. 21. The sense line interconnections shown there are redesignated as 20''' provided on the insulating layer redesignated as 21'''. The equivalent circuit is one with a shunting tunneling resistance equal to the sum of the two tunneling resistances through the tunneling barrier each taken to be that of the tunneling barrier portion above a corresponding one of the contacts to each be of length C and width W. The shunt resistance is thus $2R_A/CW$, and this is in parallel with the resistance as calculated earlier with L replaced by L−2C. The total resistance for a sheet resistance of $\rho_s$ is thus $$R_c = 2(R_A^3 \rho_s)^{1/2}/CW) \tan h\{(L-2C)/[2(R_A/\rho_s)^{1/2}]\}/ [(R_A \rho_s)^{1/2}) \tan h\{(L-2C)/[2(R_A/\rho_s)^{1/2}]\} + R_A/C].$$

If the Ra is small enough to increase the argument of the hyperbolic tangent functions so as to cause them to approach the value one, then this last expression simplifies to $$R_c = 2(R_A^3 \rho_s)^{1/2}/CW)]/[R_A/C + (R_A \rho_s)^{1/2}].$$

Let W=0.1 μm, L=0.05 μm, C=0.25 μm, $R_A$=10 or 12.5 $\Omega\text{-}\mu m^2$, and $\rho s$=5000 $\Omega/\square$. The resistance ratio change for Ra=10 initially and increasing to 12.5 is 22% (mostly due to the low tunneling shunt resistances from the contact), compared with an available 25% from the tunneling resistor itself. Thus, the conclusion is that the tunneling resistance would dominate for this case, and so the use of such contacts for this structure actually improves the magnetoresistance change values.

Arbitrarily by geometry and material choices, the current can be divided about equally through the tunneling areas over the contacts and through the resistor/tunneling combination. The equivalent circuit is approximately a half of the tunnel junction corresponding to each sense line interconnection 20' as an equivalent resistor in series with one another between sense line interconnection 20' each having half the cell voltage thereacross, and all in parallel with the synthetic antiferromagnet on the opposite side of the barrier layer fabricated to have a resistance between sense line interconnection 20' equal to the sum of the resistances of the two tunnel junction series equivalent resistors. The voltage distribution across the barrier between the two tunneling barrier portions across from the contacts is thus ignored. Thus, half the power is dissipated in the two tunnel junctions and the other half is dissipated in the synthetic antiferromagnet.

The primary heat flow can be through a thermal barrier of dielectric if the dielectric is very thin. Heat flow through contacts to good electrical conductors will be an unavoidable and can be dominant as will be shown below.

The thermal resistance of a sheet of $SiO_2$ that is $D_{SiO2}$ (cm) thick will sustain a $\Delta T_{SiO2}$ given by $$\Delta T_{SiO2} = PD_{SiO2}/A_{SiO2}K_{SiO2},$$

where $A_{SiO2}$ is the area ($cm^2$) and $K_{SiO2}$ is the thermal conductivity, which for $SiO_2$ is approximately 0.014 W/cm*K, and $P_{SiO2}$ is the power dissipated in Watts. If $A_{SiO2}$ is given by a square 0.1 mm on a side, and if $D_{SiO2}$ is 300 Å, then for a temperature change of $\Delta T_{SiO2}$=200° C. thereacross $$P_{SiO2} = A_{SiO2}K_{SiO2}\Delta T_{SiO2}/D_{SiO2} = (10^{-10})(0.014)(200)/ 30 \times 10^{-7}) = 0.093 \text{ mW}.$$

As indicated above, a minimum size transistor can control an electrical current of about 100 μA therethrough. If the source of heating is Joule heating, then the equivalent resistance would be $$P_{SiO2}/I^2 = \text{Equivalent Resistance} = (0.093*10^{-3})/10^{-8} \text{ or } 9300 \ \Omega.$$

In the case that all heating would come through the tunneling resistance, the $R_A$ product for such a current and junction area would have to be 93 $\Omega\text{-}\mu m^2$ from $I^2R=I^2 R_A/A_{SiO2}=9.3*10^{-5}=P_{SiO2}$. The voltage across the junction would, from V=IR where R is the equivalent resistance, be $9300*10^{-4}$ or 0.93 V. This magnitude of voltage would probably represent a junction reliability hazard if not an outright disaster. Far more reasonable is to keep the voltage across the junction to 0.2 V, which would imply an $R_A$ product of about 5 Ω-μm².

The thermal time constant is a further consideration. In the heat conduction equation set out above, the second derivative of temperature with respect to distance is proportional to the change of temperature with respect to time. The proportionality constant in called the thermal diffusivity which, as given above, equals the thermal conductivity divided by the product of material density and specific heat. For $SiO_2$ this is about 0.006 cm²/sec. Although heating and cooling don't have pure time constants like RC circuits, a typical estimate is that the 300 Å thickness of $SiO_2$ would have a time constant of about $$(D_{SiO2})^2/k_{d-SiO2}=(30\times10^{-7})^2/0.006=1.6 \text{ ns}.$$

Note that this time increases as the square of the thickness, so that 500 Å thickness would suggest a time constant of about 4.4 ns.

Heat will also be removed through the contacts. Titanium is a commonly used material with a relatively high resistivity and also a relatively low thermal conductivity $K_{ti}$ (0.219 W/cm*K). The relative thermal power drop across a contact bar of titanium, $P_{Ti}$, having a cross sectional area $A_{ti}$ and a length $L_{ti}$ with a temperature drop across its length of $\Delta T_{ti}$, versus the thermal power drop across the thickness $D_{SiO2}$ of a layer of $SiO_2$, $P_{SiO2}$, again with a cross sectional area $A_{SiO2}$ and a temperature drop across its thickness of $\Delta T_{SiO2}$, can be found from $$P_{ti}/P_{SiO2}=A_{ti}/A_{SiO2}*K_{ti}/K_{SiO2}*\Delta T_{ti}/\Delta T_{SiO2}*D_{SiO2}/L_{ti}.$$

A titanium bar having $L_{ti}$=0.4 mm, a width $W_{ti}$ of 0.1 μm and thickness $D_{ti}$=0.1 μm would have a relative thermal power drop across its length of (300/4000)*(0.219/0.014) or about 115% of the thermal power drop across the 300 Å thick $SiO_2$ dielectric layer of the same area considered above for the same temperature drop across each. Two such contacts would give significantly larger total heat power flow than the dielectric. Clearly, heat conduction through the contacts can be considered in lieu of the dielectric heat barrier.

However, the thermal time constant would be relatively long for such a titanium contact extending from a bit structure to a heat sink because of path length, although the thermal diffusivity $k_{d-ti}$ (0.093 cm²/sec.) of titanium is much higher than that given above for $SiO_2$. The thermal time constant for such a contact from $$\tau_{ti}\tau_{SiO2}=(L_{ti}/D_{SiO2})^2*k_{d-SiO2}/k_{d-ti}$$

based on the time constant estimated above for $SiO_2$ of 1.6 ns would be $(4000/300)^2(0.006/0.093)(1.6 \text{ ns})$=18.3 ns. The electrical resistance of such a contact for a titanium resistivity of ρ=120 μ Ω-cm would be $R=\rho L_{ti}/D_{ti}.W_{ti}$=120*4/10⁻⁵=48 Ω, which is negligible.

Using 500 Å of $SiO_2$, and ignoring parallel paths such as contacts for thermal conduction, the thermal time constant for this $SiO_2$ thermal barrier would be 4.4 ns as given above, and the minimum power needed for a 200° C. thermal rise would from $P_{SiO2-500}=P_{SiO2-300}(D_{SiO2-300}/D_{SiO2-500})$ be (0.093)(3/5)=0.056 mW based on $P_{SiO2-300}$=0.093 mW found above. Any product of junction resistance $R_{tj}$ and the square of current I that gives that power would suffice, or $P_{SiO2-500}=56*10^{-6}=I^2R_{tj}$. Making $R_j$ very large and I really small would be a desired outcome.

However, there is a constraint on $R_{tj}$ because of the magnitude limit of any voltage applied across the junction. At normal operating temperatures, junction voltages above 300 mV may be safe. But, at high temperatures, this voltage is risky because failure modes are almost sure to be accelerated. Thus, the junction voltage should be less than 300 mV, or $IR_{tj}<300*10^{-3}$.

These two constraints set the current I at 187 μA and $R_{tj}$ at 1600 Ω. For a whole junction 0.1 μm on a side, this would imply a $R_A$ of 16 Ω-μm². The transistor needed to control a current of this magnitude is also probably not of minimum size. The previously ignored, but always present, further heat leakage through the contacts raises the required power even higher thereby raising the current required and so lowering the $R_A$ value requirement still further.

If the total power required is 0.056 milliwatts as found above, and slightly more than half that power would be dissipated in the tunnel junction portions of the cell of FIG. 21 across form the two synthetic antiferromagnet contacts, assume each tunnel junction has a voltage thereacross equal to half the voltage across the device as indicated above again ignoring the actual voltage distribution across the tunnel barrier between the two portions thereof across from the contacts. If the voltage across the junction can be 0.3 V, then the voltage across the total device can be 0.6 V. The resistance of the total device from $P=V^2R$ is the power required divided into 0.6², or for the previous case 0.6²/56×10⁻⁶ or 6400 Ω. Each of the two shunting tunnel junctions would also have 6400 Ω resistance with an area of 0.025 μm². The $R_A$ product requirement is thus the same, that is, 16 Ω-μm². The magnetoresistance is improved for this structure because of more current crossing the two tunnel junction portions. Lead thermal design can use a very thin metal like titanium and get reasonable thermal time constants and temperature offsets.

However, the magnetoresistance changes would most likely in use detected using an interconnection to free layer 15 in the devices shown in FIGS. 20 and 21, and so this is indicated in each of these figures by showing there interconnection 25 in dashed lines. As a result, the magnetoresistance change of each of these devices would be similar, and so the advantage for the device in FIG. 21 in these circumstances is the better heating performance thereof.

Although the present invention has been described with reference to preferred embodiments, workers skilled in the art will recognize that changes may be made in form and detail without departing from the spirit and scope of the invention.

The invention claimed is:

1. A ferromagnetic thin-film material based digital memory, said memory comprising:
   a plurality of bit structures, each supported on a substrate and separated from one another by spacer material therebetween, and that are electrically interconnected with information retrieval circuitry, said bit structures each comprising:
   a ferromagnetic material layer, and further comprising a magnetization reference layer having therein an antiferromagnetic material and a layer of electrically insulative material having a pair of major surfaces on opposite sides thereof each against a corresponding one of said ferromagnetic material and magnetization reference layers to thereby separate them from one another with said magnetization reference layer having a major surface adjacent to said substrate on a side thereof opposite said electrically insulative material layer; and
   first and second interconnection structure contacts supported by said substrate and positioned directly against antiferromagnetic material within said magnetization reference layer major surface spaced apart from one another whereby an electrical current can be established between them through said bit structure.

2. The memory of claim 1 wherein said first and second interconnection structure contacts are positioned against said magnetization reference layer major surface inside a portion thereof that is across from said electrically insulative material layer.

3. The memory of claim 1 wherein said ferromagnetic material layer is of an anisotropic ferromagnetic material against which is positioned a third interconnection structure contact.

4. The memory of claim 3 wherein said first and second interconnection structure contacts are positioned against said magnetization reference layer major surface inside a portion thereof that is across from said electrically insulative material layer.

5. The memory of claim 1 wherein said ferromagnetic material layer has a characteristic ferromagnetic property substantially maintained below a first critical temperature above which such ferromagnetic property is not maintained.

6. The memory of claim 5 wherein said first and second interconnection structure contacts are positioned against said magnetization reference layer major surface inside a portion thereof that is across from said electrically insulative material layer.

7. The memory of claim 1 wherein said magnetization direction maintaining layer has a characteristic antiferromagnetic property substantially maintained below a first critical temperature above which such antiferromagnetic property is not maintained.

8. The memory of claim 7 wherein said first and second interconnection structure contacts are positioned against said magnetization reference layer major surface inside a portion thereof that is across from said electrically insulative material layer 9. The memory of claim 1 wherein said substrate comprises an electrical insulating layer over a monolithic integrated circuit, and further comprises via interconnection structures each providing one of first and second interconnection structure contacts to a corresponding one of said plurality of bit structures where positioned against at least one side thereof through said insulating layer to a corresponding circuit portion in said monolithic integrated circuit.

* * * * *

UNITED STATES PATENT AND TRADEMARK OFFICE
CERTIFICATE OF CORRECTION

| | | |
|---|---|---|
| PATENT NO. | : 7,813,165 B2 | Page 1 of 1 |
| APPLICATION NO. | : 11/881097 | |
| DATED | : October 12, 2010 | |
| INVENTOR(S) | : James M. Daughton and Arthur V. Pohm | |

It is certified that error appears in the above-identified patent and that said Letters Patent is hereby corrected as shown below:

Col. 30, Line 66
Insert --said-- after "against"

Signed and Sealed this
Eleventh Day of October, 2011

David J. Kappos
*Director of the United States Patent and Trademark Office*